United States Patent
Davierwalla et al.

(10) Patent No.: US 9,160,598 B2
(45) Date of Patent: Oct. 13, 2015

(54) LOW NOISE AMPLIFIERS WITH CASCODE DIVERT SWITCH FOR CARRIER AGGREGATION

(75) Inventors: Anosh Bomi Davierwalla, San Diego, CA (US); Aleksandar Miodrag Tasic, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/608,777

(22) Filed: Sep. 10, 2012

(65) Prior Publication Data

US 2013/0316669 A1 Nov. 28, 2013

Related U.S. Application Data

(60) Provisional application No. 61/652,064, filed on May 25, 2012.

(51) Int. Cl.
*H04B 1/06* (2006.01)
*H04B 7/00* (2006.01)
(Continued)

(52) U.S. Cl.
CPC ............ *H04L 27/2647* (2013.01); *H03F 1/223* (2013.01); *H03F 3/193* (2013.01); *H03F 3/68* (2013.01); *H03F 3/72* (2013.01); *H03G 3/20* (2013.01)

(58) Field of Classification Search
CPC ............. H03F 3/68; H03F 3/72; H03F 3/193; H03F 1/223; H03G 3/20; H04L 27/2647
USPC ................ 455/130–137, 150.1, 168.1, 175.1, 455/176.1, 194.1, 197.1, 201–203, 230, 455/232.1, 253.2, 293, 309, 311, 341, 208, 455/234.1, 239.1, 240.1, 241.1, 245.1, 455/246.1, 247.1, 251.1
See application file for complete search history.

(56) References Cited

U.S. PATENT DOCUMENTS 3,911,364 A 10/1975 Langseth et al.
4,035,728 A 7/1977 Ishikawa et al.
(Continued)

FOREIGN PATENT DOCUMENTS

CN 1523912 A 8/2004
CN 1922795 A 2/2007
(Continued)

OTHER PUBLICATIONS

Philips: "Capabilities of multi-transceiver UES", 3GPP Draft; R1-103913, 3rd Generation Partnership Project (3GPP), Mobile Competence Centre; 650, Route Des Lucioles; F-06921 Sophia-Antipolis Cedex; France, vol. RAN WG1, No. Dresden, Germany; 20100628, Jun. 22, 2010, XP050449298, [retrieved on Jun. 22, 2010] the whole document.
(Continued)

*Primary Examiner* — Pablo Tran
(74) *Attorney, Agent, or Firm* — Ramin Mobarhan

(57) ABSTRACT

Low noise amplifiers (LNAs) supporting carrier aggregation are disclosed. In an exemplary design, an apparatus (e.g., a wireless device, an integrated circuit, etc.) includes first and second amplifier circuits and a divert cascode transistor. Each amplifier circuit may include a gain transistor and a cascode transistor. The divert cascode transistor is coupled between the output of the first amplifier circuit and the gain transistor in the second amplifier circuit. The first and second amplifier circuits receive an input radio frequency (RF) signal including transmissions sent on multiple carriers at different frequencies to a wireless device. The first and second amplifier circuits and the divert cascode transistor are controlled to amplify the input RF signal and provide (i) one amplified RF signal for one set of carriers in a first operating mode or (ii) two amplified RF signals for two sets of carriers in a second operating mode.

20 Claims, 16 Drawing Sheets

(51) Int. Cl.
  *H04L 27/26* (2006.01)
  *H03G 3/20* (2006.01)
  *H03F 1/22* (2006.01)
  *H03F 3/193* (2006.01)
  *H03F 3/68* (2006.01)
  *H03F 3/72* (2006.01)

(56) References Cited

U.S. PATENT DOCUMENTS

| | | |
|---|---|---|
| 4,035,729 A | 7/1977 | Perry |
| 4,246,655 A | 1/1981 | Parker |
| 4,326,294 A | 4/1982 | Okamoto et al. |
| 4,715,048 A | 12/1987 | Masamura |
| 4,742,563 A | 5/1988 | Fukumura |
| 4,756,023 A | 7/1988 | Kojima |
| 4,969,207 A | 11/1990 | Sakamoto et al. |
| 5,056,411 A | 10/1991 | Baker |
| 5,128,630 A * | 7/1992 | Mijuskovic ............... 330/253 |
| 5,291,519 A | 3/1994 | Tsurumaru |
| 5,321,850 A | 6/1994 | Backstrom et al. |
| 5,345,601 A | 9/1994 | Takagi et al. |
| 5,390,342 A | 2/1995 | Takayama et al. |
| 5,559,838 A | 9/1996 | Nakagoshi |
| 5,566,364 A | 10/1996 | Mizoguchi et al. |
| 5,694,396 A | 12/1997 | Firouzbakht et al. |
| 5,697,083 A | 12/1997 | Sano |
| 5,761,613 A | 6/1998 | Saunders et al. |
| 5,794,159 A | 8/1998 | Portin |
| 5,805,643 A | 9/1998 | Seki et al. |
| 5,805,989 A | 9/1998 | Ushida |
| 5,835,853 A | 11/1998 | Enoki et al. |
| 5,940,452 A | 8/1999 | Rich |
| 5,999,815 A | 12/1999 | TenBrook et al. |
| 5,999,990 A | 12/1999 | Sharrit et al. |
| 6,026,288 A | 2/2000 | Bronner |
| 6,040,732 A * | 3/2000 | Brokaw ............... 327/408 |
| 6,044,254 A | 3/2000 | Ohta et al. |
| 6,063,961 A | 5/2000 | Kroner |
| 6,069,923 A | 5/2000 | Ostman et al. |
| 6,088,348 A | 7/2000 | Bell, III et al. |
| 6,208,844 B1 | 3/2001 | Abdelgany |
| 6,249,687 B1 | 6/2001 | Thomsen et al. |
| 6,407,689 B1 | 6/2002 | Bazarjani et al. |
| 6,424,683 B1 | 7/2002 | Schoellhorn |
| 6,430,237 B1 | 8/2002 | Anvari |
| 6,472,947 B1 | 10/2002 | Zeitz |
| 6,473,601 B1 | 10/2002 | Oda |
| 6,522,895 B1 | 2/2003 | Montalvo |
| 6,535,725 B2 * | 3/2003 | Hatcher et al. ............... 455/317 |
| 6,600,759 B1 | 7/2003 | Wood |
| 6,600,907 B1 | 7/2003 | Taguchi |
| 6,600,931 B2 | 7/2003 | Sutton et al. |
| 6,657,498 B2 | 12/2003 | Park et al. |
| 6,806,777 B2 | 10/2004 | Franca-Neto |
| 6,819,941 B2 | 11/2004 | Dening et al. |
| 6,888,888 B1 | 5/2005 | Tu et al. |
| 6,952,594 B2 | 10/2005 | Hendin |
| 6,954,446 B2 | 10/2005 | Kuffner |
| 6,983,132 B2 | 1/2006 | Woo et al. |
| 6,985,712 B2 | 1/2006 | Yamakawa et al. |
| 6,987,950 B2 | 1/2006 | Coan |
| 7,013,166 B2 | 3/2006 | Clifford |
| 7,023,272 B2 * | 4/2006 | Hung et al. ............... 330/126 |
| 7,024,172 B1 | 4/2006 | Murphy et al. |
| 7,039,377 B2 | 5/2006 | Yates |
| 7,123,891 B2 | 10/2006 | Loke |
| 7,142,042 B1 * | 11/2006 | Henry ............... 327/538 |
| 7,161,423 B2 * | 1/2007 | Paul et al. ............... 330/51 |
| 7,167,044 B2 * | 1/2007 | Li et al. ............... 330/129 |
| 7,187,239 B2 | 3/2007 | Yeh |
| 7,187,735 B2 | 3/2007 | Kent, III et al. |
| 7,187,904 B2 | 3/2007 | Gainey et al. |
| 7,212,788 B2 | 5/2007 | Weber et al. |
| 7,224,231 B2 | 5/2007 | Wu |
| 7,260,377 B2 | 8/2007 | Burns et al. |
| 7,283,851 B2 | 10/2007 | Persico et al. |
| 7,299,021 B2 | 11/2007 | Parssinen et al. |
| 7,313,368 B2 | 12/2007 | Wu et al. |
| 7,317,894 B2 | 1/2008 | Hirose |
| 7,333,831 B2 | 2/2008 | Srinivasan et al. |
| 7,356,325 B2 | 4/2008 | Behzad et al. |
| 7,403,508 B1 | 7/2008 | Miao |
| 7,444,166 B2 | 10/2008 | Sahota et al. |
| 7,454,181 B2 | 11/2008 | Banister et al. |
| 7,477,106 B2 | 1/2009 | Van Bezooijen et al. |
| 7,570,111 B1 | 8/2009 | Vagher et al. |
| 7,599,675 B2 | 10/2009 | Mu et al. |
| 7,643,847 B2 * | 1/2010 | Daanen et al. ............... 455/552.1 |
| 7,643,848 B2 | 1/2010 | Robinett et al. |
| 7,697,905 B2 | 4/2010 | Lee et al. |
| 7,728,664 B2 | 6/2010 | Chang et al. |
| 7,751,513 B2 | 7/2010 | Eisenhut et al. |
| 7,764,726 B2 | 7/2010 | Simic et al. |
| 7,848,724 B2 | 12/2010 | Bult et al. |
| 7,869,528 B2 | 1/2011 | Robinson |
| 7,877,075 B1 * | 1/2011 | Jin et al. ............... 455/313 |
| 7,911,269 B2 | 3/2011 | Yang et al. |
| 7,944,298 B2 | 5/2011 | Cabanillas et al. |
| 7,949,309 B2 | 5/2011 | Rofougaran et al. |
| 7,952,398 B2 | 5/2011 | Salcido et al. |
| 8,022,772 B2 | 9/2011 | Cassia et al. |
| 8,055,229 B2 | 11/2011 | Huang |
| 8,063,706 B2 | 11/2011 | Li et al. |
| 8,081,672 B2 | 12/2011 | Kent et al. |
| 8,090,332 B2 | 1/2012 | Sahota et al. |
| 8,090,369 B2 | 1/2012 | Kitazoe |
| 8,139,670 B1 | 3/2012 | Son et al. |
| 8,149,955 B2 | 4/2012 | Tired |
| 8,195,117 B2 | 6/2012 | Bult et al. |
| 8,208,887 B2 | 6/2012 | Lee et al. |
| 8,217,723 B2 * | 7/2012 | Rajendran et al. ............... 330/311 |
| 8,242,841 B2 | 8/2012 | Zhang |
| 8,270,927 B2 | 9/2012 | Wallace et al. |
| 8,290,449 B2 | 10/2012 | Keehr et al. |
| 8,295,778 B2 | 10/2012 | Kotecha et al. |
| 8,306,494 B2 | 11/2012 | Ojo |
| 8,442,473 B1 | 5/2013 | Kaukovuori et al. |
| 8,514,015 B2 | 8/2013 | Chen |
| 8,600,315 B2 * | 12/2013 | Roufoogaran et al. ......... 455/78 |
| 8,626,084 B2 | 1/2014 | Chan et al. |
| 8,676,148 B2 * | 3/2014 | Ogasawara ............... 455/341 |
| 8,706,069 B2 | 4/2014 | Khoini-Poorfard et al. |
| 2002/0008575 A1 | 1/2002 | Oskowsky et al. |
| 2002/0061773 A1 | 5/2002 | Adachi et al. |
| 2002/0111163 A1 | 8/2002 | Hamabe |
| 2002/0132597 A1 | 9/2002 | Peterzell et al. |
| 2002/0173337 A1 | 11/2002 | Hajimiri et al. |
| 2002/0193108 A1 | 12/2002 | Robinett |
| 2003/0076797 A1 | 4/2003 | Lozano |
| 2003/0081694 A1 | 5/2003 | Wieck |
| 2003/0125040 A1 | 7/2003 | Walton et al. |
| 2003/0148750 A1 | 8/2003 | Yan et al. |
| 2003/0157915 A1 | 8/2003 | Atkinson et al. |
| 2003/0176176 A1 | 9/2003 | Leinonen et al. |
| 2003/0203743 A1 | 10/2003 | Sugar et al. |
| 2003/0206076 A1 | 11/2003 | Hashemi et al. |
| 2003/0228851 A1 | 12/2003 | Taniguchi |
| 2004/0087290 A1 | 5/2004 | Schmidt et al. |
| 2004/0092243 A1 | 5/2004 | Hey-Shipton |
| 2004/0113746 A1 | 6/2004 | Brindle |
| 2004/0116086 A1 | 6/2004 | Huttunen |
| 2004/0121753 A1 | 6/2004 | Sugar et al. |
| 2004/0204104 A1 | 10/2004 | Horng et al. |
| 2004/0219959 A1 | 11/2004 | Khayrallah et al. |
| 2004/0224643 A1 | 11/2004 | Nakai |
| 2004/0253955 A1 | 12/2004 | Love et al. |
| 2004/0266356 A1 | 12/2004 | Javor et al. |
| 2005/0039060 A1 | 2/2005 | Okayasu |
| 2005/0075077 A1 | 4/2005 | Mach et al. |
| 2005/0079847 A1 | 4/2005 | Arafa |
| 2005/0118977 A1 | 6/2005 | Drogi et al. |
| 2005/0197090 A1 | 9/2005 | Stockstad et al. |
| 2005/0215264 A1 | 9/2005 | Subramaniam et al. |

(56) References Cited

U.S. PATENT DOCUMENTS

| | | |
|---|---|---|
| 2005/0231290 A1 | 10/2005 | Hung et al. |
| 2005/0248402 A1* | 11/2005 | Zhenbiao et al. ............. 330/129 |
| 2005/0265084 A1 | 12/2005 | Choi |
| 2005/0277387 A1 | 12/2005 | Kojima et al. |
| 2006/0009177 A1 | 1/2006 | Persico et al. |
| 2006/0023745 A1 | 2/2006 | Koo et al. |
| 2006/0061773 A1 | 3/2006 | Lee et al. |
| 2006/0121937 A1 | 6/2006 | Son |
| 2006/0128322 A1 | 6/2006 | Igarashi et al. |
| 2006/0146693 A1 | 7/2006 | Mori et al. |
| 2006/0170503 A1 | 8/2006 | Lee et al. |
| 2006/0189286 A1 | 8/2006 | Kyu et al. |
| 2006/0222100 A1 | 10/2006 | Behzad |
| 2006/0234662 A1 | 10/2006 | Diloisy |
| 2006/0291428 A1 | 12/2006 | Filipovic |
| 2007/0049332 A1 | 3/2007 | Higuchi |
| 2007/0060080 A1 | 3/2007 | Nishimura et al. |
| 2007/0072577 A1 | 3/2007 | Rozenblit et al. |
| 2007/0105517 A1 | 5/2007 | Chang et al. |
| 2007/0142013 A1 | 6/2007 | Bucknor et al. |
| 2007/0177656 A1 | 8/2007 | Maruta et al. |
| 2007/0177693 A1 | 8/2007 | Kluge |
| 2007/0184801 A1 | 8/2007 | Kogawa et al. |
| 2007/0197170 A1 | 8/2007 | Boos |
| 2007/0197178 A1 | 8/2007 | Gu |
| 2007/0197204 A1 | 8/2007 | Herczog et al. |
| 2007/0202890 A1 | 8/2007 | Feher |
| 2007/0242784 A1 | 10/2007 | Sampson et al. |
| 2007/0243832 A1 | 10/2007 | Park et al. |
| 2007/0262817 A1 | 11/2007 | Ciccarelli et al. |
| 2007/0262871 A1 | 11/2007 | Yamagajo et al. |
| 2008/0004078 A1 | 1/2008 | Barratt et al. |
| 2008/0013654 A1 | 1/2008 | Rick et al. |
| 2008/0117999 A1 | 5/2008 | Kadous et al. |
| 2008/0139151 A1 | 6/2008 | Ojo et al. |
| 2008/0204148 A1 | 8/2008 | Kim et al. |
| 2008/0224770 A1 | 9/2008 | Kim et al. |
| 2008/0224791 A1 | 9/2008 | Cheng |
| 2008/0225971 A1 | 9/2008 | Behzad |
| 2008/0261650 A1 | 10/2008 | Piriyapoksombut et al. |
| 2008/0297259 A1 | 12/2008 | Mu |
| 2009/0124227 A1 | 5/2009 | Ishiguro |
| 2009/0227214 A1 | 9/2009 | Georgantas et al. |
| 2009/0237161 A1 | 9/2009 | Fagg |
| 2009/0243869 A1 | 10/2009 | Sanderford, Jr. |
| 2009/0253456 A1 | 10/2009 | Toh et al. |
| 2009/0290659 A1 | 11/2009 | Petrovic et al. |
| 2009/0323779 A1 | 12/2009 | Lennen |
| 2010/0019970 A1 | 1/2010 | Farrokhi et al. |
| 2010/0034094 A1 | 2/2010 | Tenny |
| 2010/0040178 A1 | 2/2010 | Sutton et al. |
| 2010/0041359 A1 | 2/2010 | Liu et al. |
| 2010/0142440 A1 | 6/2010 | Inoue |
| 2010/0195754 A1 | 8/2010 | Li et al. |
| 2010/0197263 A1 | 8/2010 | Dwyer et al. |
| 2010/0210226 A1 | 8/2010 | Matsuyama |
| 2010/0210272 A1 | 8/2010 | Sundstrom et al. |
| 2010/0210299 A1 | 8/2010 | Gorbachov |
| 2010/0214184 A1 | 8/2010 | Tran et al. |
| 2010/0225414 A1 | 9/2010 | Gorbachov |
| 2010/0226327 A1 | 9/2010 | Zhang et al. |
| 2010/0232493 A1 | 9/2010 | Thirumoorthy |
| 2010/0237947 A1 | 9/2010 | Xiong et al. |
| 2010/0253435 A1 | 10/2010 | Ichitsubo et al. |
| 2010/0265875 A1 | 10/2010 | Zhao et al. |
| 2010/0271986 A1 | 10/2010 | Chen |
| 2010/0272051 A1 | 10/2010 | Fu et al. |
| 2010/0301946 A1 | 12/2010 | Borremans |
| 2010/0311378 A1 | 12/2010 | Tasic et al. |
| 2010/0328155 A1 | 12/2010 | Simic et al. |
| 2010/0330977 A1 | 12/2010 | Kadous et al. |
| 2011/0018635 A1 | 1/2011 | Tasic et al. |
| 2011/0044380 A1 | 2/2011 | Marra et al. |
| 2011/0050319 A1 | 3/2011 | Wong |
| 2011/0084791 A1 | 4/2011 | Mun et al. |
| 2011/0086603 A1 | 4/2011 | Toosi et al. |
| 2011/0110463 A1 | 5/2011 | Chang et al. |
| 2011/0122972 A1 | 5/2011 | Lie et al. |
| 2011/0165848 A1 | 7/2011 | Gorbachov et al. |
| 2011/0193625 A1 | 8/2011 | Gatta et al. |
| 2011/0194504 A1 | 8/2011 | Gorokhov et al. |
| 2011/0204973 A1 | 8/2011 | Hu et al. |
| 2011/0211533 A1 | 9/2011 | Casaccia et al. |
| 2011/0217945 A1 | 9/2011 | Uehara et al. |
| 2011/0222443 A1 | 9/2011 | Khlat |
| 2011/0222444 A1 | 9/2011 | Khlat et al. |
| 2011/0242999 A1 | 10/2011 | Palanki et al. |
| 2011/0250926 A1 | 10/2011 | Wietfeldt et al. |
| 2011/0268048 A1 | 11/2011 | Toskala et al. |
| 2011/0268232 A1 | 11/2011 | Park et al. |
| 2011/0292844 A1 | 12/2011 | Kwun et al. |
| 2011/0299434 A1 | 12/2011 | Gudem et al. |
| 2011/0300810 A1 | 12/2011 | Mikhemar et al. |
| 2012/0009886 A1 | 1/2012 | Poulin |
| 2012/0013387 A1 | 1/2012 | Sankaranarayanan et al. |
| 2012/0026862 A1 | 2/2012 | Sadri et al. |
| 2012/0044927 A1 | 2/2012 | Pan et al. |
| 2012/0056681 A1 | 3/2012 | Lee |
| 2012/0057621 A1 | 3/2012 | Hong et al. |
| 2012/0195237 A1 | 8/2012 | Chan et al. |
| 2012/0236829 A1 | 9/2012 | Takano et al. |
| 2012/0293265 A1 | 11/2012 | Heikkinen et al. |
| 2012/0294299 A1 | 11/2012 | Fernando |
| 2012/0327825 A1 | 12/2012 | Gudem et al. |
| 2012/0329395 A1 | 12/2012 | Husted et al. |
| 2013/0003617 A1 | 1/2013 | Gudem et al. |
| 2013/0003783 A1 | 1/2013 | Gudem et al. |
| 2013/0043946 A1 | 2/2013 | Hadjichristos et al. |
| 2013/0051284 A1 | 2/2013 | Khlat |
| 2013/0114769 A1 | 5/2013 | Fernando |
| 2013/0163492 A1 | 6/2013 | Wong |
| 2013/0217398 A1 | 8/2013 | Winiecki et al. |
| 2013/0230080 A1 | 9/2013 | Gudem et al. |
| 2013/0231064 A1 | 9/2013 | Gudem et al. |
| 2013/0265892 A1 | 10/2013 | Fernando |
| 2013/0315348 A1 | 11/2013 | Tasic et al. |
| 2013/0316668 A1 | 11/2013 | Davierwalla et al. |
| 2013/0316670 A1 | 11/2013 | Tasic et al. |
| 2013/0329665 A1 | 12/2013 | Kadous et al. |
| 2014/0072001 A1 | 3/2014 | Chang et al. |
| 2014/0113578 A1 | 4/2014 | Xu |
| 2014/0269853 A1 | 9/2014 | Gudem et al. |

FOREIGN PATENT DOCUMENTS

| | | |
|---|---|---|
| CN | 101228702 A | 7/2008 |
| CN | 101242158 A | 8/2008 |
| CN | 101523967 A | 9/2009 |
| CN | 101789805 A | 7/2010 |
| EP | 1164719 A1 | 12/2001 |
| EP | 1370012 | 12/2003 |
| EP | 1398887 A1 | 3/2004 |
| EP | 1708372 A2 | 10/2006 |
| EP | 1726098 A1 | 11/2006 |
| EP | 1748567 A2 | 1/2007 |
| EP | 1761076 A2 | 3/2007 |
| EP | 2068583 A1 | 6/2009 |
| EP | 2141818 A1 | 1/2010 |
| EP | 1916767 B1 | 12/2010 |
| EP | 2393205 A2 | 12/2011 |
| EP | 2398285 A1 | 12/2011 |
| GB | 2472978 A | 3/2011 |
| JP | 05227234 | 9/1993 |
| JP | H0730452 A | 1/1995 |
| JP | 07221684 | 8/1995 |
| JP | 9027778 A | 1/1997 |
| JP | 09116458 | 5/1997 |
| JP | H11127300 A | 5/1999 |
| JP | 2000013278 A | 1/2000 |
| JP | 2001285114 A | 10/2001 |
| JP | 2002261880 A | 9/2002 |
| JP | 2004015162 A | 1/2004 |
| JP | 2006520143 A | 8/2006 |
| JP | 2007324711 A | 12/2007 |

(56) References Cited

FOREIGN PATENT DOCUMENTS

| | | |
|---|---|---|
| JP | 2008085793 A | 4/2008 |
| JP | 2008519535 A | 6/2008 |
| JP | 2009130867 A | 6/2009 |
| JP | 2011015112 A | 1/2011 |
| JP | 2011082669 A | 4/2011 |
| JP | 2011091747 A | 5/2011 |
| JP | 2011119807 A | 6/2011 |
| WO | 0150636 | 7/2001 |
| WO | 0237686 | 5/2002 |
| WO | 2005039060 | 4/2005 |
| WO | 2005062477 A2 | 7/2005 |
| WO | 2005088847 A1 | 9/2005 |
| WO | 2006050515 A2 | 5/2006 |
| WO | 2006118538 A2 | 11/2006 |
| WO | 2008059257 A1 | 5/2008 |
| WO | 2008084539 A1 | 7/2008 |
| WO | 2008092745 A1 | 8/2008 |
| WO | 2008103757 | 8/2008 |
| WO | 2008145604 A1 | 12/2008 |
| WO | 2010059257 A1 | 5/2010 |
| WO | 2011019850 A1 | 2/2011 |
| WO | 2011050729 A1 | 5/2011 |
| WO | 2011092005 A1 | 8/2011 |
| WO | 2011138697 A1 | 11/2011 |
| WO | 2012008705 A2 | 1/2012 |
| WO | 2012049529 A1 | 4/2012 |
| WO | 2013036794 A1 | 3/2013 |
| WO | 2013131047 | 9/2013 |

OTHER PUBLICATIONS

Chen, et al, "A 5-6 GHz 1-V CMOS Direct-Conversion Receiver With an Integrated Quadrature Coupler," IEEE Journal of Solid-State Circuits, vol. 42, No. 9, pp. 1963-1975, 2007.

Chen, et al., "A monolithic 5.9-GHz CMOS I/Q direct-down converter utilizing a quadrature coupler and transformer-coupled subharmonic mixers," Microwave and Wireless Components Letters, IEEE , vol. 16, No. 4, pp. 197-199, 2006.

Garuda, et al., "A Multi-band CMOS RF Front-end for 4G WiMAX and WLAN Applications," 2006 IEEE International Symposium on Circuits and Systes, 2006. ISCAS 2006. May 2006, 4 pages.

Kim, T.W., et al., Highly Linear Receiver Front-End Adopting MOSFET Transconductance Linearization by Multiple Gated Transistors, IEEE Journal of Solid-State Circuits, United States, IEEE, Jan. 1, 2004, vol. 39, No. 1, pp. 223-229.

3GPP TS 36.101 V11.0.0, 3rd Generation Partnership Project; Technical Specification Group Radio Access Network; Evolved Universal Terrestrial Radio Access (E-UTRA); User Equipment (UE) radio transmission and reception (Release 11), Mar. 2012.

Aparin et al., "A Highly-integrated tri-band/quad-mode SiGe BiCMOS RF-to-baseband and receiver for wireless CDMA/WCDMA/AMPS applications with GPS capability", Solid-State Circuits Conference, 2002. Digest of Technical Papers. 2002 IEEE International Feb. 3-7, 2002, Piscataway, NJ, USA, IEEE, vol. 1, 2002, pp. 234-235, XP010585547, ISBN: 0-7803-7335-9.

Broyde F., et al., "The Noise Performance of aMultiple-Input-Port and Multiple-Output-Port Low-Noise Amplifier Connected to an Array of Coupled Antennas," International Journal of Antennas and Propagation, vol. 2011, Article ID 438478, Jul. 18, 2011, 12 pages.

Hashemi, et al., "Concurrent Multiband Low-Noise Amplifiers—Theory, Design, and Applications," IEEE Transactions on Microwave Theory and Techniques, vol. 50, No. 1, Jan. 2002.

Henrik M et al., "A Full Duplex Front End Module for WiFi 802.11.n Applications", European Microwave Association, vol. 12, No. 4, Oct. 2008, pp. 162-165.

Hwang, et al., "A High IIP2 Direct-Conversion Receiver using Even-Harmonic Reduction Technique for Cellular CDMA/PCS/GPS applications," IEEE Transaction on Circuits and Systems.

International Search Report and Written Opinion—PCT/US2013/042741—ISA/EPO—Aug. 26, 2013.

Jones W. W., et al., "Narrowband interference suppression using filter-bank analysis/synthesis techniques", Military Communications Conference, 1992. MILC0M '92, Conference REC0R D. Communications—Fusing Command, Control and Intelligence., IEEE San Diego, CA, USA, Oct. 11-14, 1992, New York, NY, USA, IEEE, US, Oct. 11, 1992, pp. 898-902, XP010060840, DOI: 10.1109/MILCOM.1992.243977, ISBN: 978-0-7803-0585-4.

Jussi R et al., "A Dual-Band RF Front-End for WCDMA and GSM Applications", IEEE, Journal Solid-State Circuits, 2001, vol. 36, No. 8, pp. 1198-1204.

Kevin W et al., "3G/4G Multimode Cellular Front End Challenges", Part 2: Architecture Discussion, RFMD® White Paper, 9 pages.

Lai, C.M.,et al., "Compact router transceiver architecture for carrier aggregation systems", Microwave Conference (EUMC), 2011 41st European, IEEE, Oct. 10, 2011, pp. 693-696, XP032072825, ISBN: 978-1-61284-235-6 the whole document.

Lee et al., "Development of Miniature Quad SAW filter bank based on PCB substrate", IEEE Intl Frequency Control Symp, pp. 146-149, 2007.

MSM6000 Chipset Solution, Qualcomm Incorporated.

MSM6500 Chipset Solution, Qualcomm Incorporated.

Pitschi M. et al., "High Performance Microwave Acoustic Components for Mobile Radios", Ultrasonics Symposium (IUS), 2009 IEEE International, EPCOS AG, Munich, Germany, vol. 1, Sep. 20-23, 2009.

Qualcomm Europe: "UE Implementation Impact due to 4C-HSDPA Operation", 3GPP Draft; R1-094067_UE_IMPL_IMPACT_4C_HSDPA, 3rd Generation Partnership Project (3GPP), Mobile Competence Centre ; 650, Route Des Luci0les ; F-06921 Sophia-Antipolis Cedex ; France, No. Miyazaki; 20091012, Oct. 12, 2009, XP050388547, [retrieved on Oct. 6, 2009].

Rahn D.G., et al., "A fully integrated multiband MIMO WLAN transceiver RFIC," IEEE J. Solid-State Circuits, 2005, vol. 40 (8), 1629-1641.

Sever et al. "A Dual-Antenna Phase-Array Ultra-Wideband CMOS Transceiver". IEEE Communications Magazine [Online] 2006, vol. 44, Issue 8, pp. 102-110. See pp. 104-107.

Tasic A. et al., "Design of Adaptive Multimode RF Front-End Circuits", IEEE Journal of Solid-State Circuits, vol. 42, Issue 2, Feb. 2007 pp. 313-322.

"UMTS Picocell Front End Module", CTS Corp. 8 pages.

Winternitz, et al., "A GPS Receiver for High-Altitude Satellite Navigation," IEEE Journal of Selected Topics in Signal Processing, vol. 3, No. 4, pp. 541-556, Aug. 2009.

\* cited by examiner

LOW NOISE AMPLIFIERS WITH CASCODE DIVERT SWITCH FOR CARRIER AGGREGATION

CLAIM OF PRIORITY UNDER 35 U.S.C. §119

The present Application for Patent claims priority to Provisional U.S. Application Ser. No. 61/652,064, entitled "LOW NOISE AMPLIFIERS FOR CARRIER AGGREGATION," filed May 25, 2012, assigned to the assignee hereof, and expressly incorporated herein by reference.

BACKGROUND

I. Field

The present disclosure relates generally to electronics, and more specifically to low noise amplifiers (LNAs).

II. Background

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated RF signal, amplify the modulated RF signal to obtain an amplified RF signal having the proper output power level, and transmit the amplified RF signal via an antenna to a base station. For data reception, the receiver may obtain a received RF signal via the antenna and may amplify and process the received RF signal to recover data sent by the base station.

A wireless device may support carrier aggregation, which is simultaneous operation on multiple carriers. A carrier may refer to a range of frequencies used for communication and may be associated with certain characteristics. For example, a carrier may be associated with system information describing operation on the carrier. A carrier may also be referred to as a component carrier (CC), a frequency channel, a cell, etc. It is desirable to efficiently support carrier aggregation by the wireless device.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

LNAs supporting carrier aggregation are disclosed herein. These LNAs may be used for various types of electronic devices such as wireless communication devices.

Figure 1:
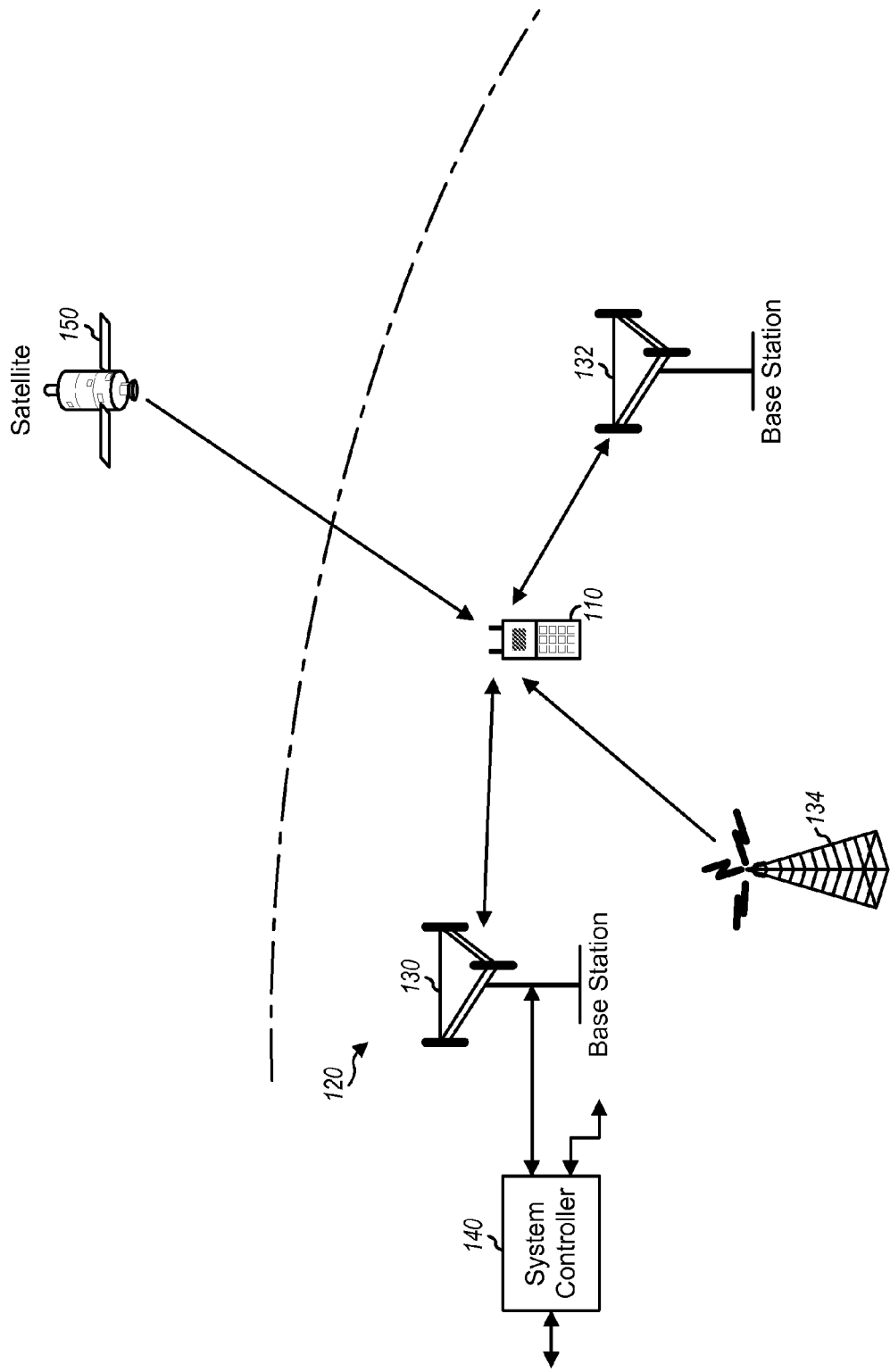
FIG. 1 shows a wireless device communicating with a wireless system.

FIG. 1 shows a wireless device 110 communicating with a wireless communication system 120. Wireless system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), Time Division Synchronous CDMA (TD-SCDMA), cdma2000, or some other version of CDMA. For simplicity, FIG. 1 shows wireless system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may be capable of communicating with wireless system 120. Wireless device 110 may also be capable of receiving signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, cdma2000, WCDMA, TD-SCDMA, GSM, 802.11, etc.

Wireless device 110 may support carrier aggregation, which is operation on multiple carriers. Carrier aggregation may also be referred to as multi-carrier operation. Wireless device 110 may be able to operate in low-band from 698 to 960 megahertz (MHz), mid-band from 1475 to 2170 MHz, and/or high-band from 2300 to 2690 and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to 5 carriers in one or two bands in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
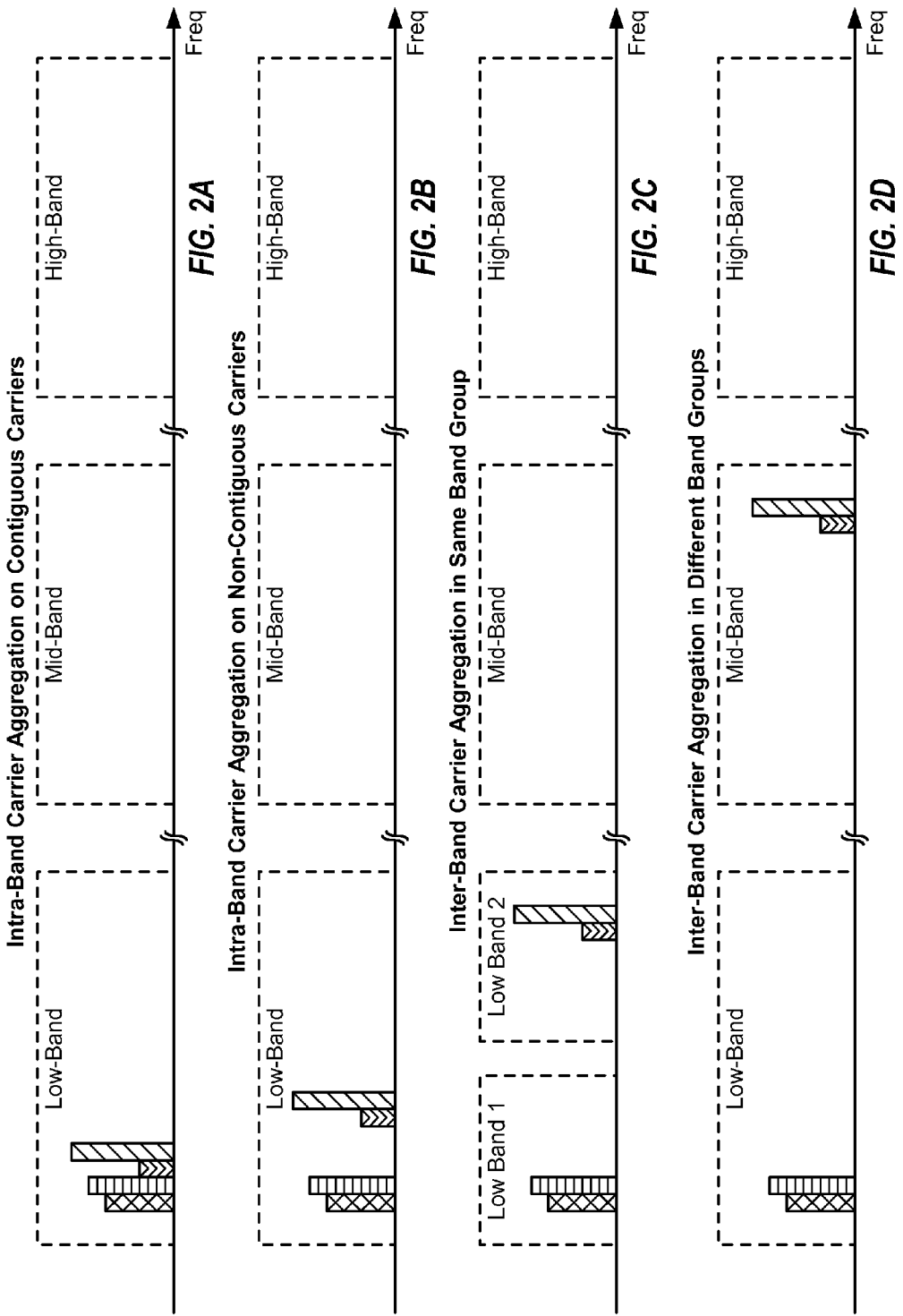
FIGS. 2A to 2D show four examples of carrier aggregation (CA).

FIG. 2A shows an example of contiguous intra-band CA. In the example shown in FIG. 2A, wireless device 110 is configured with four contiguous carriers in the same band, which is a band in low-band. Wireless device 110 may send and/or receive transmissions on multiple contiguous carriers within the same band.

FIG. 2B shows an example of non-contiguous intra-band CA. In the example shown in FIG. 2B, wireless device 110 is configured with four non-contiguous carriers in the same band, which is a band in low-band. The carriers may be separated by 5 MHz, 10 MHz, or some other amount. Wireless device 110 may send and/or receive transmissions on multiple non-contiguous carriers within the same band.

FIG. 2C shows an example of inter-band CA in the same band group. In the example shown in FIG. 2C, wireless device 110 is configured with four carriers in two bands in the same band group, which is low-band. Wireless device 110 may send and/or receive transmissions on multiple carriers in different bands in the same band group (e.g., low-band in FIG. 2C).

FIG. 2D shows an example of inter-band CA in different band groups. In the example shown in FIG. 2D, wireless device 110 is configured with four carriers in two bands in different band groups, which include two carriers in one band in low-band and two additional carriers in another band in mid-band. Wireless device 110 may send and/or receive transmissions on multiple carriers in different bands in different band groups (e.g., low-band and mid-band in FIG. 2D).

FIGS. 2A to 2D show four examples of carrier aggregation. Carrier aggregation may also be supported for other combinations of bands and band groups. For example, carrier aggregation may be supported for low-band and high-band, mid-band and high-band, high-band and high-band, etc.

Figure 3:
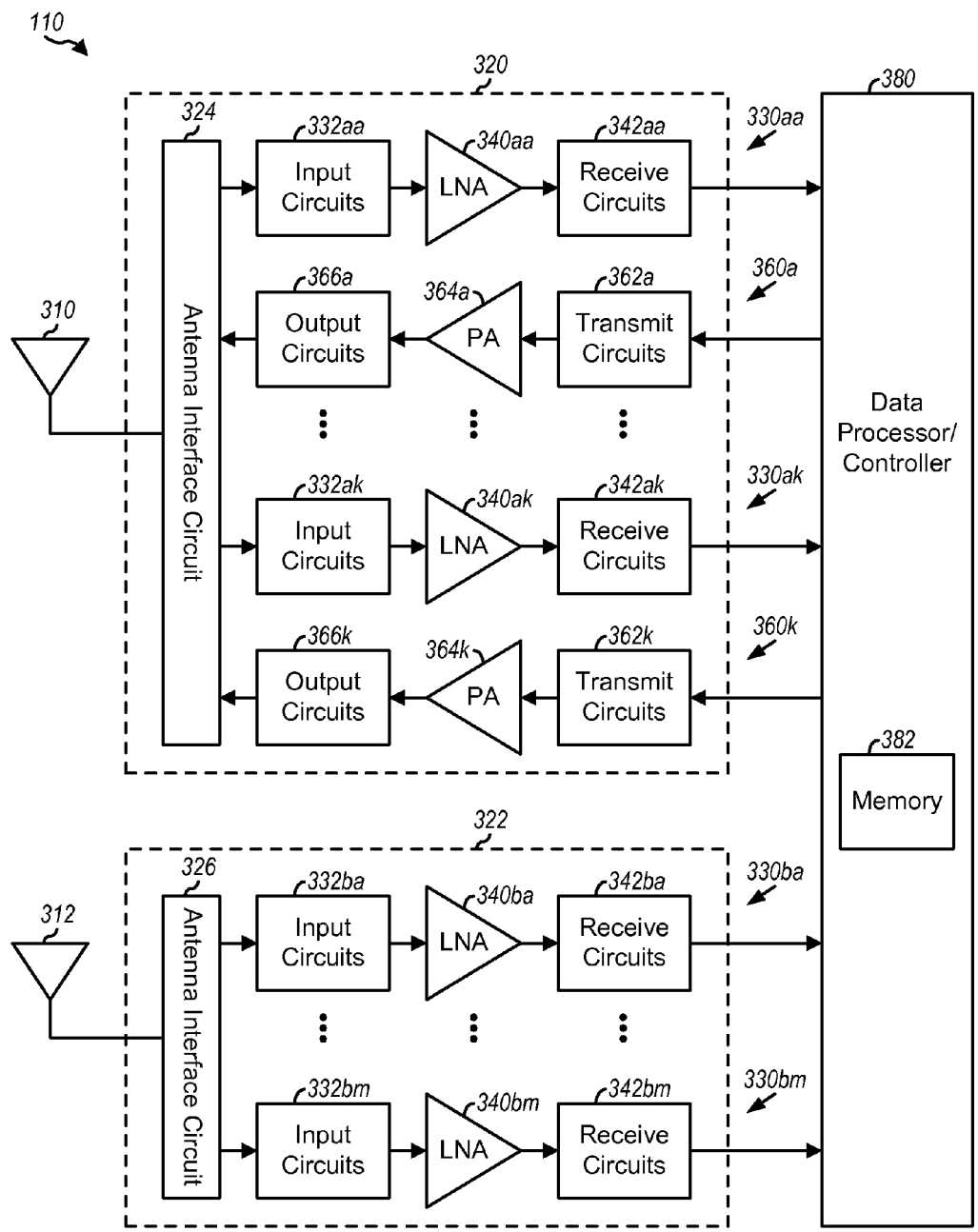
FIG. 3 shows a block diagram of the wireless device in FIG. 1.

FIG. 3 shows a block diagram of an exemplary design of wireless device 110 in FIG. 1. In this exemplary design, wireless device 110 includes a transceiver 320 coupled to a primary antenna 310, receivers 322 coupled to a secondary antenna 312, and a data processor/controller 380. Transceiver 320 includes multiple (K) receivers 330aa to 330ak and multiple (K) transmitters 360a to 360k to support multiple bands, carrier aggregation, multiple radio technologies, etc. Receivers 322 include multiple (M) receivers 330ba to 330bm to support multiple bands, carrier aggregation, multiple radio technologies, receive diversity, MIMO transmission from multiple transmit antennas to multiple receive antennas, etc.

In the exemplary design shown in FIG. 3, each receiver 330 includes input circuits 332, an LNA 340, and receive circuits 342. For data reception, antenna 310 receives signals from base stations and/or other transmitter stations and provides a received RF signal, which is routed through an antenna interface circuit 324 and provided to a selected receiver. Antenna interface circuit 324 may include switches, duplexers, transmit filters, receive filters, etc. The description below assumes that receiver 330aa is the selected receiver. Within receiver 330aa, the received RF signal is passed through input circuits 332aa, which provides an input RF signal to an LNA 340aa. Input circuits 332aa may include a matching circuit, a receive filter, etc. LNA 340aa amplifies the input RF signal and provides an output RF signal. Receive circuits 342aa amplify, filter, and downconvert the output RF signal from RF to baseband and provide an analog input signal to data processor 380. Receive circuits 332aa may include mixers, filters, amplifiers, matching circuits, an oscillator, a local oscillator (LO) generator, a phase locked loop (PLL), etc. Each remaining receiver 330 in transceiver 320 and each receiver 330 in receivers 322 may operate in similar manner as receiver 330aa in transceiver 320.

In the exemplary design shown in FIG. 3, each transmitter 360 includes transmit circuits 362, a power amplifier (PA) 364, and output circuits 366. For data transmission, data processor 380 processes (e.g., encodes and modulates) data to be transmitted and provides an analog output signal to a selected transmitter. The description below assumes that transmitter 360a is the selected transmitter. Within transmitter 360a, transmit circuits 362a amplify, filter, and upconvert the analog output signal from baseband to RF and provide a modulated RF signal. Transmit circuits 362a may include amplifiers, filters, mixers, matching circuits, an oscillator, an LO generator, a PLL, etc. A PA 364a receives and amplifies the modulated RF signal and provides a transmit RF signal having the proper output power level. The transmit RF signal is passed through output circuits 366a, routed through antenna interface circuit 324, and transmitted via antenna 310. Output circuits 366a may include a matching circuit, a transmit filter, a directional coupler, etc.

FIG. 3 shows an exemplary design of receivers 330 and transmitters 360. A receiver and a transmitter may also include other circuits not shown in FIG. 3, such as filters, matching circuits, etc. All or a portion of transceiver 320 and receivers 322 may be implemented on one or more analog integrated circuits (ICs), RF ICs (RFICs), mixed-signal ICs, etc. For example, LNAs 340, receive circuits 342, and transmit circuits 362 may be implemented on one module, which may be an RFIC, etc. Antenna interface circuits 324 and 326, input circuits 332, output circuits 366, and PAs 364 may be implemented on another module, which may be a hybrid module, etc. The circuits in transceiver 320 and receivers 322 may also be implemented in other manners.

Data processor/controller 380 may perform various functions for wireless device 110. For example, data processor 380 may perform processing for data being received via receivers 330 and data being transmitted via transmitters 360. Controller 380 may control the operation of antenna interface circuits 324 and 326, input circuits 332, LNAs 340, receive circuits 342, transmit circuits 362, PAs 364, output circuits 366, or a combination thereof. A memory 382 may store program codes and data for data processor/controller 380. Data processor/controller 380 may be implemented on one or more application specific integrated circuits (ASICs) and/or other ICs.

Wireless device 110 may receive transmissions from one or more base stations/cells on multiple carriers at different frequencies for carrier aggregation. For intra-band CA, the transmissions are sent on different carriers in the same band. For inter-band CA, the transmissions are sent on multiple carriers in different bands.

Figure 4A:
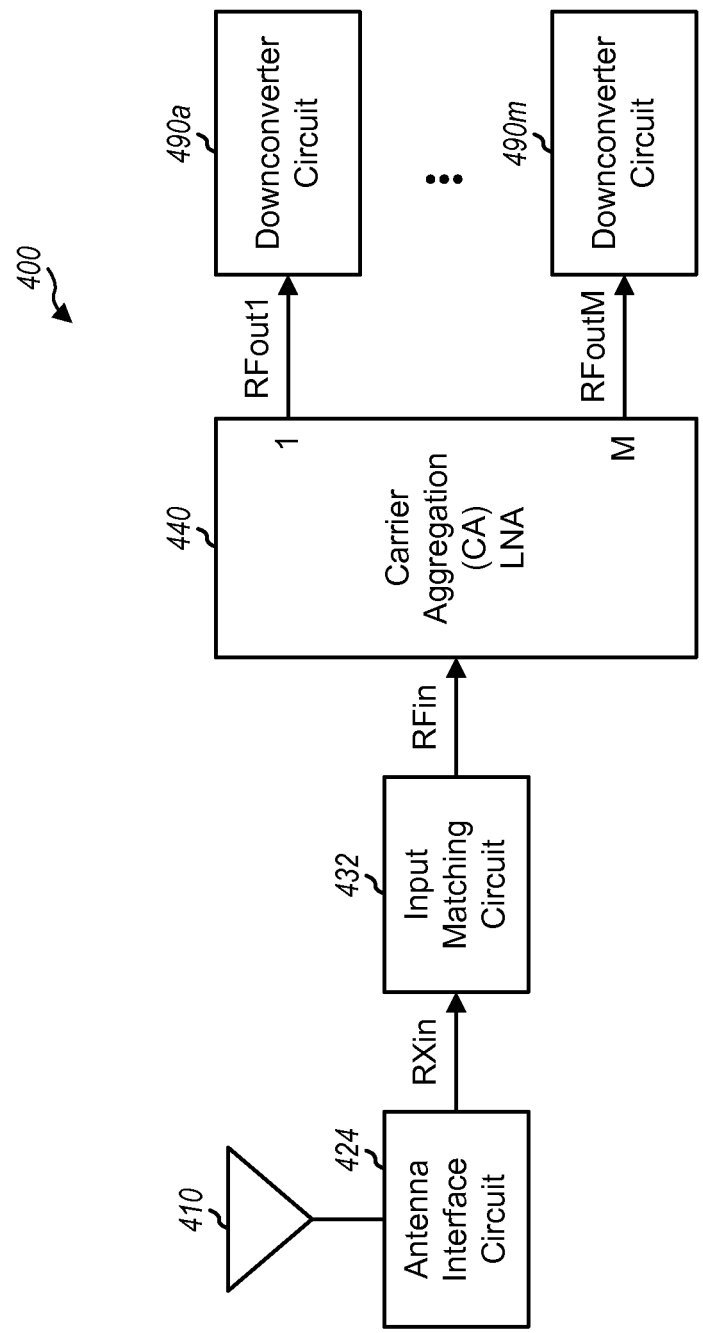
FIGS. 4A and 4B show a receiver supporting intra-band CA.

FIG. 4A shows a block diagram of an exemplary design of a receiver 400 with a CA-capable LNA 440 supporting no CA and intra-band CA. CA LNA 440 may be used for one or more LNAs 340 in FIG. 3. CA LNA 440 includes a single input and multiple (M) outputs, where M>1.

At receiver 400, an antenna 410 receives downlink signals comprising one or more transmissions sent on one or more carriers and provides a received RF signal to an antenna interface circuit 424. Antenna interface circuit 424 filters and routes the received RF signal and provides a receiver input signal, RXin. An input matching circuit 432 receives the RXin signal and provides an input RF signal, RFin, to CA LNA 440. Matching circuit 432 performs impedance and/or power matching between CA LNA 440 and either antenna interface circuit 424 or antenna 410 for a band of interest. Matching circuit 432 may be part of one of input circuits 332 in FIG. 3.

CA LNA 440 receives and amplifies the input RF signal and provides (i) one output RF signal via one LNA output for either no CA or CA on one set of carriers or (ii) up to M output RF signals, RFout1 to RFoutM, via up to M LNA outputs for intra-band CA on up to M sets of carriers. M downconverter circuits 490a to 490m are coupled to the M LNA outputs. Each downconverter circuit 490, when enabled, downconverts an associated output RF signal such that one or more transmissions on one or more carriers of interest are downconverted from RF to baseband.

A CA LNA, such as CA LNA 440 in FIG. 4A, may operate in a single-output mode or a multi-output mode at any given moment. In the single-output mode, the CA LNA operates in a 1-input 1-output (1×1) configuration, receives one input RF signal comprising one or more transmissions on one set of carriers, and provides one output RF signal to one downconverter circuit. The single-output mode may be used to receive a transmission sent on a single carrier without carrier aggregation. The single-output mode may also be used to receive transmissions sent on multiple carriers (e.g., contiguous carriers) with carrier aggregation. In this case, the transmissions on all carriers may be downconverted with a single LO signal at a single frequency. In the multi-output mode, the CA LNA operates in a 1×M configuration, receives one input RF signal comprising multiple transmissions on M sets of carriers, and provides M output RF signals to M downconverter circuits, one output RF signal for each set of carriers, where M>1. Each set of carriers may include one or more carriers in one band.

Figure 4B:
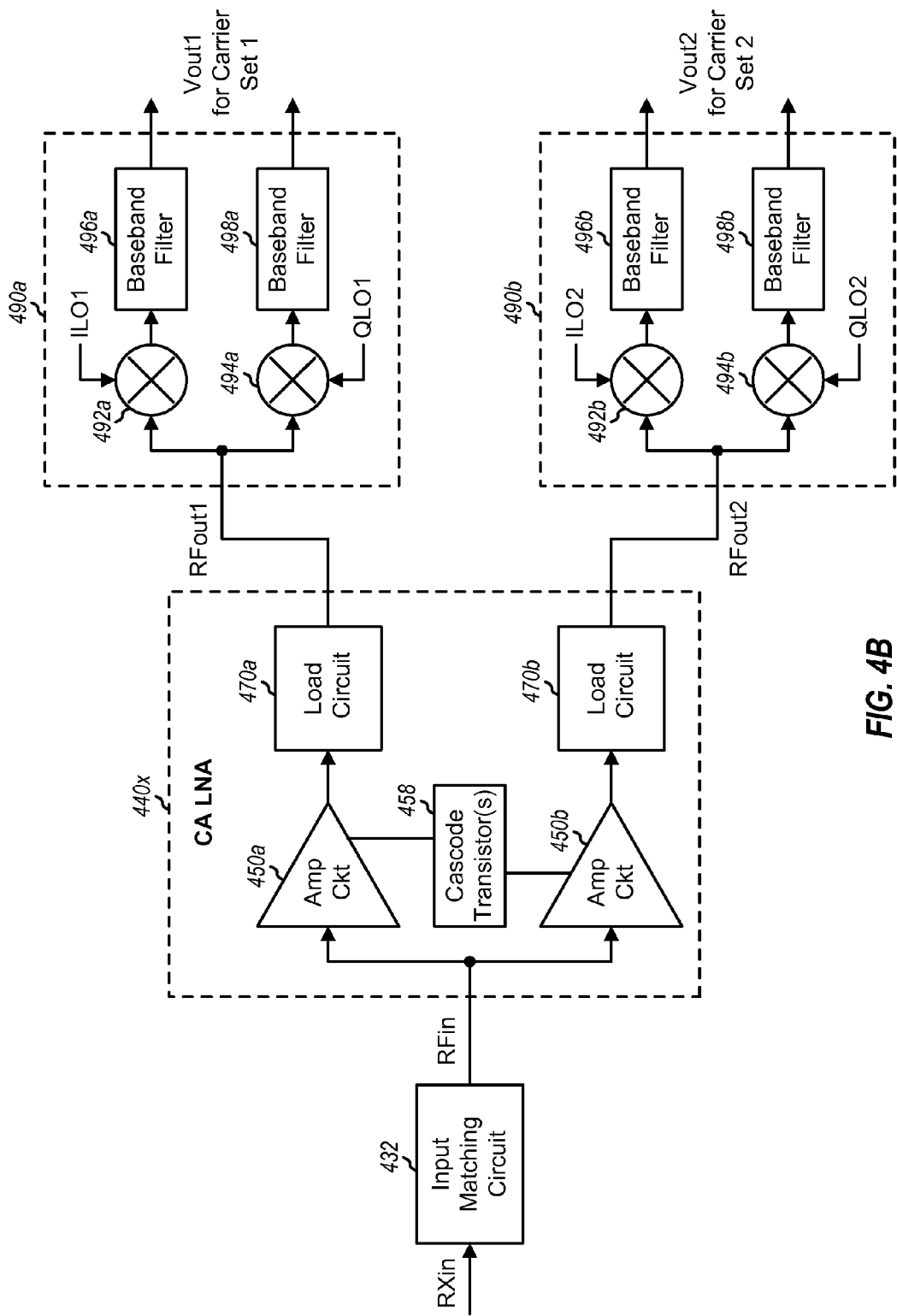

FIG. 4B shows a block diagram of an exemplary design of a CA LNA 440x supporting no CA and intra-band CA on up to two sets of carriers in one band. CA LNA 440x is one exemplary design of CA LNA 440 in FIG. 4A.

In the exemplary design shown in FIG. 4B, CA LNA 440x includes two amplifier circuits (Amp Ckt) 450a and 450b, one or more divert cascode transistors 458, and two load circuits 470a and 470b for two LNA outputs. An amplifier circuit may also be referred to as an amplifier stage, an input stage, a gain circuit, etc. An input RF signal is provided to both amplifier circuits 450a and 450b. Each amplifier circuit 450 amplifies the input RF signal and provides a corresponding amplified RF signal when the amplifier circuit is enabled. One of divert cascode transistor(s) 458 may be enabled to divert RF current from amplifier circuit 450b to amplifier circuit 450a, or vice versa, as described below. Load circuits 470a and 470b receive the amplified RF signals from amplifier circuits 450a and 450b, respectively, and provide output RF signals to downconverter circuits 490a and 490b, respectively.

In the exemplary design shown in FIG. 4B, each downconverter circuit 490 includes two mixers 492 and 494 coupled to two baseband filters 496 and 498, respectively. Within downconverter circuit 490a, a mixer 492a receives a first output RF signal, RFout1, from load circuit 470a and an inphase LO signal, ILO1, at a first mixing frequency for a first set of carriers. Mixer 492a downconverts the first output RF signal with the ILO1 signal and provides an inphase (I) downconverted signal. A mixer 494a receives the first output RF signal from load circuit 470a and a quadrature LO signal, QLO1, at the first mixing frequency. Mixer 494a downconverts the first output RF signal with the QLO1 signal and provides a quadrature (Q) downconverted signal. Filters 496a and 498a receive and filter the I and Q downconverted signals from mixers 492a and 494a, respectively, and provide I and Q baseband signals, Vout1, for the first set of carriers.

Downconverters 490a and 490b may be enabled to receive transmissions on up to two sets of carriers. Each downconverter 490 may receive a respective output RF signal from CA LNA 440x, downconvert its output RF signal with a respective LO signal at a suitable mixing frequency, and provide I and Q baseband signals for one set of carriers. Downconverters 490a and 490b may perform downconversion with different mixing frequencies for two sets of carriers.

FIG. 4B shows an exemplary design of downconverter circuits 490. A downconverter circuit may also include different and/or additional circuits. For example, a downconverter circuit may include an amplifier coupled before the mixers, or between the mixers and the filters, or after the filters.

FIG. 4B shows an exemplary design of CA LNA 440x with two amplifier circuits 450 and two load circuits 470 for two LNA outputs. A CA LNA may also include more than two amplifier circuits and/or more than two load circuits for more than two LNA outputs. A CA LNA may include any number of divert cascode transistors. Each divert cascode transistor may be coupled between two amplifier circuits and may divert RF current between these amplifier circuits.

Figure 5A:
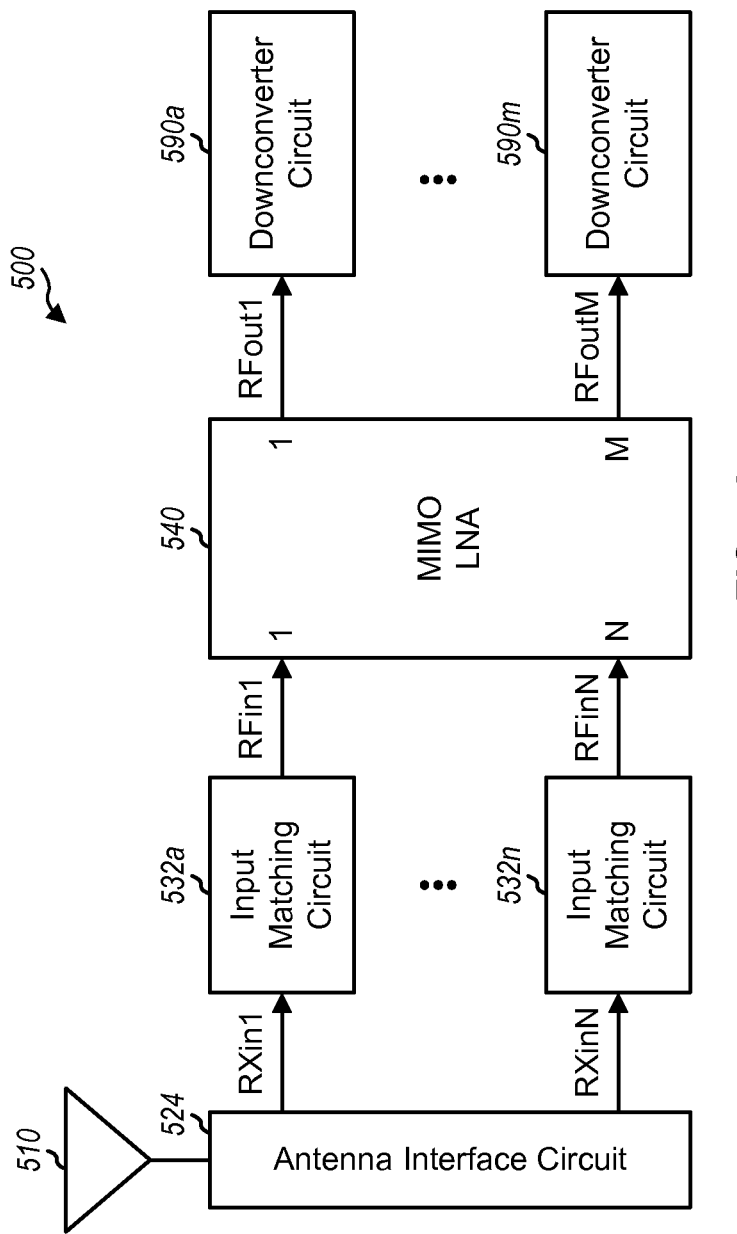
FIGS. 5A and 5B show a receiver supporting intra-band CA and inter-band CA.

FIG. 5A shows a block diagram of an exemplary design of a receiver 500 with a MIMO LNA 540 supporting no CA, intra-band CA, and inter-band CA. MIMO LNA 540 may be used for one or more LNAs 340 in FIG. 3. MIMO LNA 540 includes multiple (N) inputs and multiple (M) outputs and may be referred to as an N x M MIMO LNA, where N>1 and M>1.

At receiver 500, an antenna 510 receives downlink signals comprising one or more transmissions sent on one or more carriers in the same band or different bands. Antenna 510 provides a received RF signal to an antenna interface circuit 524. Antenna interface circuit 524 filters and routes the received RF signal and provides up to N receiver input signals, RXin1 to RXinN, to up to N input matching circuits 532a to 532n, respectively. Matching circuits 532a to 532n provide up to N input RF signals, RFin1 to RFinN, respectively, to MIMO LNA 540. Matching circuits 532a to 532n may be part of one or more input circuits 332 in FIG. 3. Each matching circuit 532 performs impedance and/or power matching between MIMO LNA 540 and either antenna interface circuit 524 or antenna 510 for one or more bands of interest. The N matching circuits 532a to 532n may be designed for different bands.

MIMO LNA 540 receives up to N input RF signals and amplifies (i) one input RF signal for no CA or intra-band CA or (i) up to N input RF signals for inter-band CA. MIMO LNA 540 provides (i) one output RF signal via one LNA output for either no CA or CA on one set of carriers or (ii) up to M output RF signals, RFout1 to RFoutM, via up to M LNA outputs for intra-band CA or inter-band CA. M downconverter circuits 590a to 590m are coupled to the M LNA outputs. Each downconverter circuit 590, when enabled, downconverts an associated output RF signal such that one or more transmissions on one or more carriers of interest are downconverted from RF to baseband.

A MIMO LNA, such as MIMO LNA 540 in FIG. 5A, may operate in a single-output mode, an intra-band CA mode, or an inter-band CA mode at any given moment. In the single-output mode, the MIMO LNA operates in a 1×1 configuration, receives one input RF signal comprising one or more transmissions on one set of carriers, and provides one output RF signal to one downconverter circuit. In the intra-band CA mode, the MIMO LNA operates in a 1×M configuration, receives one input RF signal comprising transmissions on M sets of carriers in the same band, and provides M output RF signals to M downconverter circuits, one output RF signal for each set of carriers, where M>1. In the inter-band CA mode, the MIMO LNA operates in an N×M configuration, receives N input RF signals comprising transmissions on M sets of carriers in up to N different bands, and provides M output RF signals to M load circuits, where M>1 and N>1. The N input RF signals may correspond to up to N different bands.

A MIMO LNA, such as MIMO LNA 540 in FIG. 5A, may be used to receive transmissions on multiple carriers at different frequencies. A MIMO LNA may include multiple outputs providing multiple output RF signals for different carriers or different sets of carriers of interest. A MIMO LNA is different from LNAs used to receive a MIMO transmission sent from multiple transmit antennas to multiple receive antennas. An LNA for a MIMO transmission typically has (i) one input receiving one input RF signal from one receive antenna and (ii) one output providing one output RF signal. The multiple outputs of a MIMO LNA thus cover frequency dimension whereas the outputs of LNAs used for a MIMO transmission cover spatial dimension.

Figure 5B:
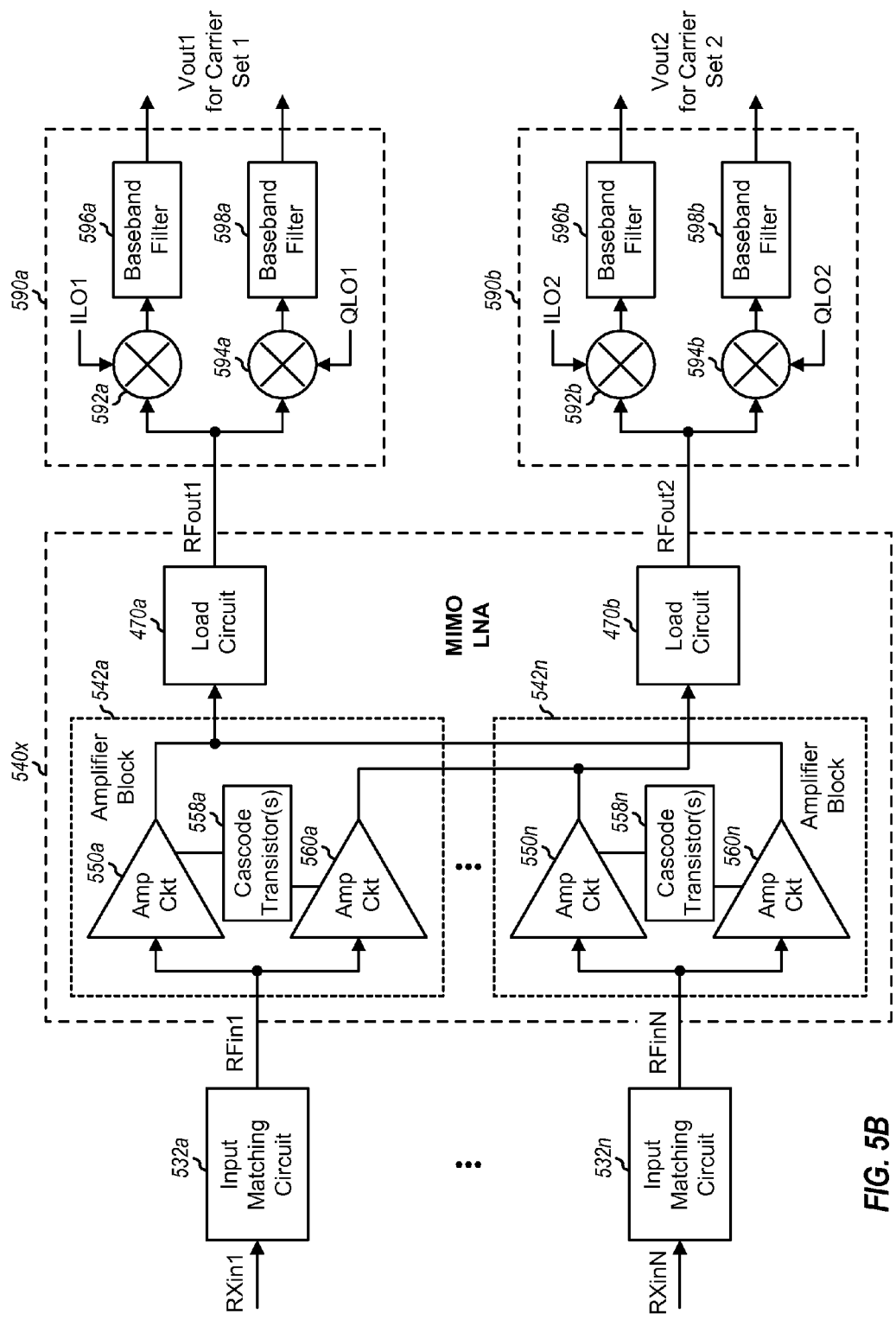

FIG. 5B shows a block diagram of an exemplary design of a MIMO LNA 540x supporting no CA, intra-band CA, and inter-band CA. MIMO LNA 540x can support CA on multiple sets of carriers in one or more bands. Each set of carriers may include one or more carriers in one band. MIMO LNA 540x is one exemplary design of MIMO LNA 540 in FIG. 5A.

N input matching circuits 532a to 532n receive N receiver input signals, RXin1 to RXinN, and provide N input RF signals, RFin1 to RFinN. Matching circuits 532a to 532n may receive (i) the same receiver input signal from one antenna or (ii) different receiver input signals from one or more antennas. Hence, the RXin1 to RXinN signals may be the same signal or different signals. Each matching circuit 532 performs input matching for one or more bands of interest. For example, the RXin1 to RXinN signals may be the same signal from one antenna, and matching circuits 532a to 532n may perform input matching for different bands. As another example, the RXin1 to RXinN signals may be different signals from different antennas, and matching circuits 532a to 532n may perform input matching for the same band or different bands.

In the exemplary design shown in FIG. 5B, MIMO LNA 540x includes N amplifier (Amp) blocks 542a to 542n for N LNA inputs and two load circuits 570a and 570b for two LNA outputs. Each amplifier block 542 includes two amplifier circuits 550 and 560 and one or more divert cascode transistors 558. The N input RF signals, RFin1 to RFinN, are provided to the N amplifier blocks 542a to 542n, respectively. L amplifier blocks 542 may be enabled to receive transmissions on K sets of carriers, where 1≤L≤N and 1≤K≤2 . The N-L remaining amplifier blocks 542 may be disabled. Each enabled amplifier block 542 receives and amplifies its input RF signal and provides one or two amplified RF signals. The K load circuits 570 receive K amplified RF signals from all enabled amplifier blocks 642 and provide K output RF signals to K downconverter circuits 590 coupled to the K load circuits.

In the exemplary design shown in FIG. 5B, each downconverter circuit 590 includes two mixers 592 and 594 coupled to two baseband filters 596 and 598, respectively. Mixers 592 and 594 and filters 596 and 598 are coupled and operate as described above for mixers 492 and 494 and filters 496 and 498 in FIG. 4B. Up to K downconverters 590 may be selected to receive transmission on up to K sets of carriers. Each downconverter 590 may process and downconvert its output RF signal from LNA 540 and provide I and Q baseband signals for a different set of carriers.

CA LNA 440 in FIG. 4A may be implemented with various circuit architectures. Some exemplary designs of CA LNA 440 are described below. CA LNA 440 may also be implemented with transistors of various types. Some exemplary designs of CA LNA 440 implemented with N-channel metal oxide semiconductor (NMOS) transistors are described below.

Figure 6A:
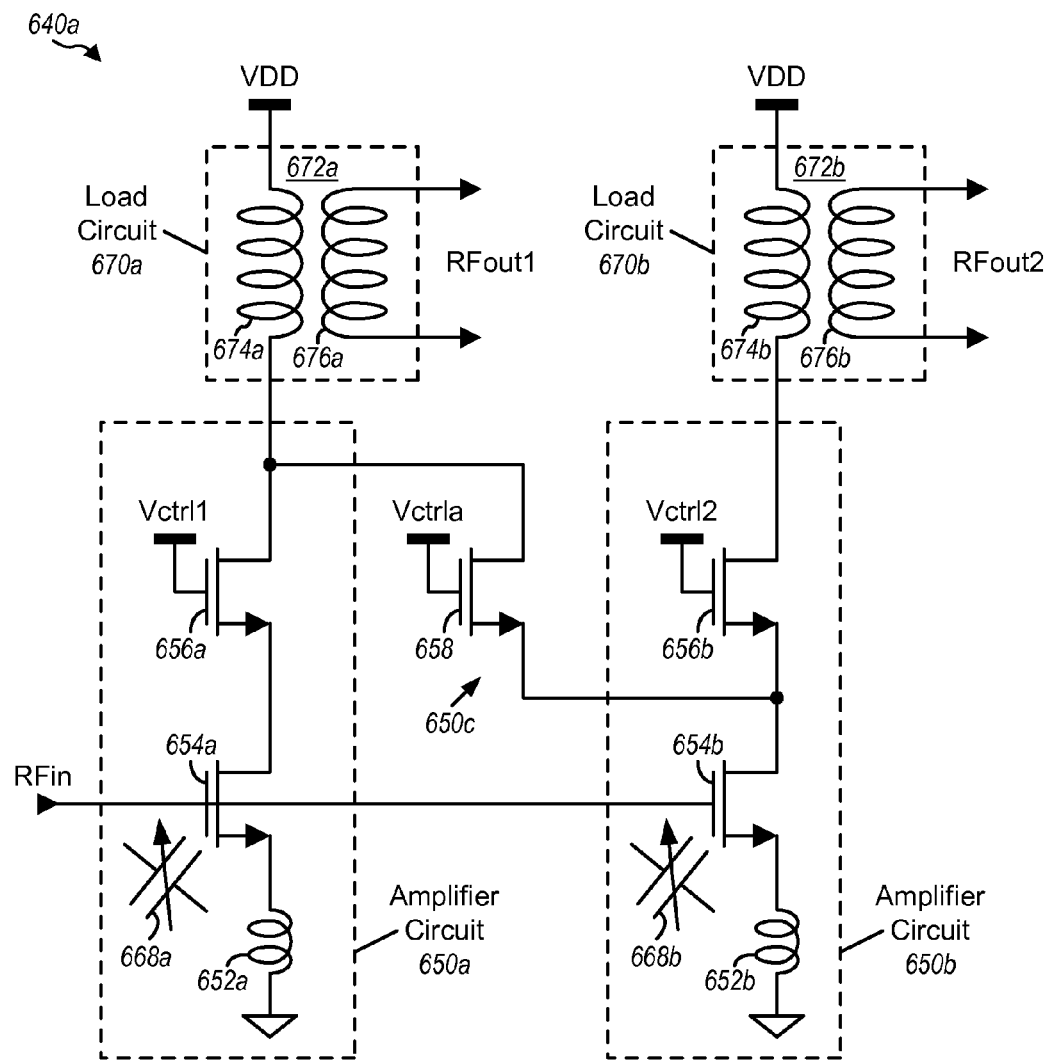
FIGS. 6A to 6C show an exemplary design of an LNA with inductive degeneration and cascode divert switch.

FIG. 6A shows a schematic diagram of an exemplary design of a CA LNA 640a with inductive degeneration and cascode divert switch. CA LNA 640a is one exemplary design of CA LNA 440 in FIG. 4A. CA LNA 640a includes two amplifier circuits 650a and 650b, a divert cascode transistor 658, and two load circuits 670a and 670b. CA LNA 640a receives an input RF signal, which may include transmissions on one or two sets of carriers, with each set including one or more carriers.

In the exemplary design shown in FIG. 6A, each amplifier circuit 650 includes a source degeneration inductor 652, a gain transistor 654, and a cascode transistor 656. Within amplifier circuit 650a, a gain transistor 654a has its gate receiving the input RF signal and its source coupled to one end of inductor 652a. The other end of inductor 652a is coupled to circuit ground. Cascode transistor 656a has its source coupled to the drain of gain transistor 654a, its gate receiving a first control signal, Vcrtl1, and its drain coupled to load circuit 670a. Amplifier circuit 650b includes a source degeneration inductor 652b, a gain transistor 654b, and a cascode transistor 656b, which are coupled in similar manner as inductor 652a and transistors 654a and 656a in amplifier circuit 650a. Divert cascode transistor 658 has its source coupled to the drain of gain transistor 654b, its gate receiving a third control signal, Vctrla, and its drain coupled to load circuit 670a. Gain transistor 654b, cascode transistor 658, and inductor 652b may be considered as part of an amplifier circuit 650c that is coupled in parallel with amplifier circuit 650a. Gain transistors 654 and cascode transistors 656 and 658 may be implemented with NMOS transistors, as shown in FIG. 6A, or with transistors of other types.

Amplifier circuits 650 may also be implemented in other manners. In another exemplary design, an amplifier circuit may include a gain transistor having its source coupled directly to circuit ground (instead of to a source degeneration inductor). In yet another exemplary design, an amplifier circuit may include two gain transistors coupled in parallel and having their gates receiving the input RF signal. A first gain transistor may have its source coupled to a source degeneration inductor, as shown in FIG. 6A. A second gain transistor may have its source coupled directly to circuit ground. Either the first or second gain transistor may be selected.

In the exemplary design shown in FIG. 6A, each load circuit 670 includes a transformer 672 comprising a primary coil 674 and a secondary coil 676. Within load circuit 670a, a transformer 672a includes (i) a primary coil 674a coupled between the drains of cascode transistor 656a and 658 and a power supply, VDD, and (ii) a secondary coil 676a providing a differential first output RF signal. Load circuit 670b includes a transformer 672b having (i) a primary coil 674b coupled between the drain of cascode transistor 656b and the VDD supply and (ii) a secondary coil 676b providing a differential second output RF signal.

Load circuits 670 may also be implemented in other manners. In another exemplary design, a load circuit may include an inductor and possibly a capacitor coupled between the VDD supply and the drain of a cascode transistor. The cascode transistor may provide an output RF signal at its drain. In yet another exemplary design, a load circuit may include a P-channel metal oxide semiconductor (PMOS) transistor having its source coupled to the VDD supply and its drain coupled to the drain of a cascode transistor. The PMOS transistor may provide an active load for the cascode transistor.

For simplicity, FIG. 6A shows CA LNA 640a including two amplifier circuits 650a and 650b and two load circuits 670a and 670b for two sets of carriers. CA LNA 640a may include more than two amplifier circuits 650 and more than two load circuits 670 for more than two sets of carriers.

CA LNA 640a may operate in a single-output mode or a multi-output mode at any given moment. In the single-output mode, CA LNA 640a receives transmissions on one set of carriers and provides one output RF signal to one downconverter circuit. In the multi-output mode, CA LNA 640a receives transmissions on two sets of carriers and provides two output RF signals to two downconverter circuits, one output RF signal for each set of carriers.

Figure 6B:
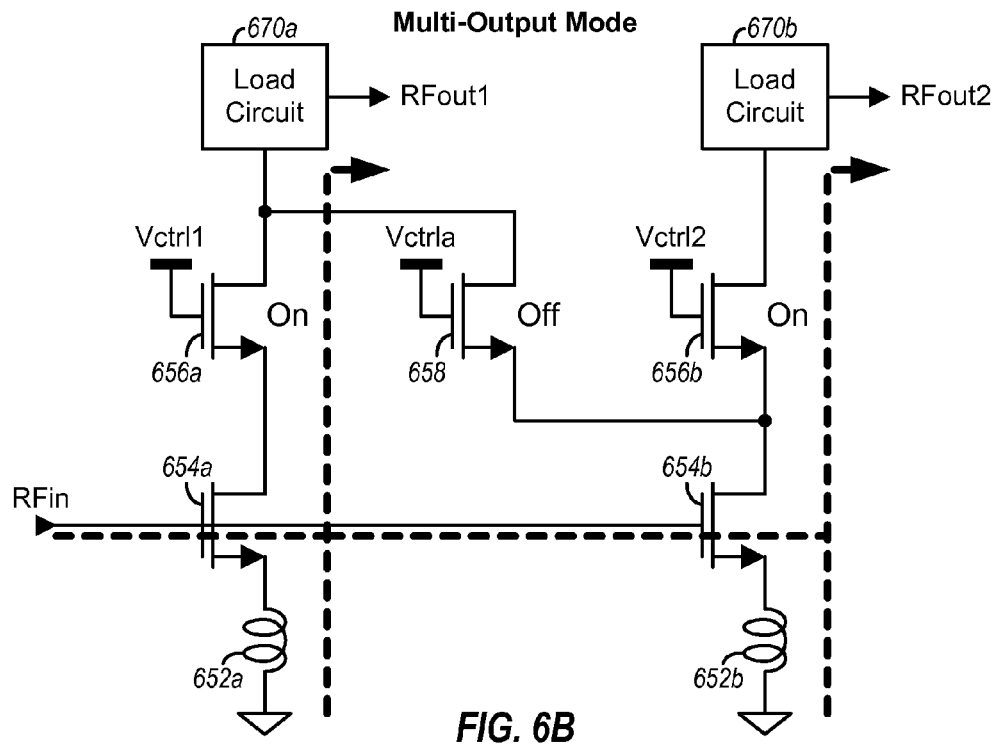

FIG. 6B shows operation of CA LNA 640a in the multi-output mode. In the multi-output mode, both amplifier circuits 650a and 650b are enabled by providing appropriate bias voltages on the Vctrl1 and Vctrl2 signals at the gates of cascode transistors 656a and 656b, respectively. Divert cascode transistor 658 is disabled by providing a low voltage on the Vctrla signal. Amplifier circuit 650a amplifies the input RF signal and provides a first amplified RF signal to load circuit 670a. Amplifier circuit 650b amplifies the input RF signal and provides a second amplified RF signal to load circuit 670b.

Figure 6C:
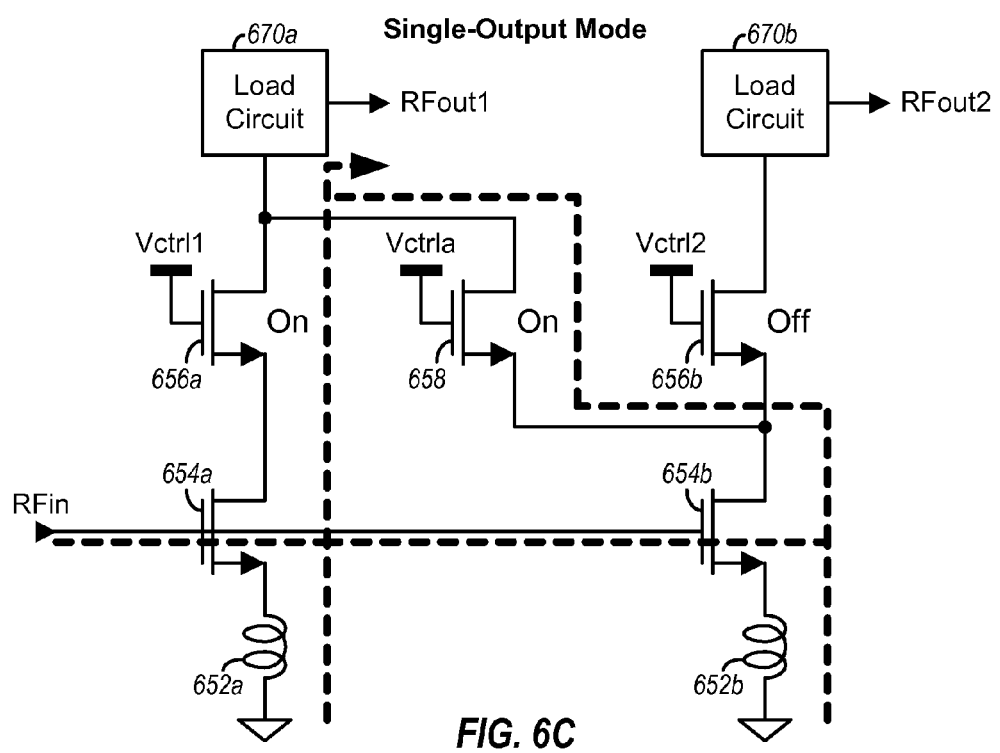

FIG. 6C shows operation of CA LNA 640a in the single-output mode. In the single-output mode, both gain transistors 654a and 654b are enabled by providing appropriate bias voltages on the Vctrl1 and Vctrla signals at the gates of cascode transistors 656a and 658, respectively. Cascode transistor 656b is disabled by providing a low voltage on the Vctrl2 signal. Amplifier circuits 650a and 650c amplify the input RF signal and provide an amplified RF signal to load circuit 670a. In particular, gain transistor 654a and 654b amplify the input RF signal and provide an amplified RF signal via cascode transistors 656a and 658 to load circuit 670a.

In the exemplary design shown in FIG. 6A, an input RF signal is split at the "gate" level by having the input RF signal applied to two gain transistors 654a and 654b. The input RF signal may also be split at a "cascode" level by having the input RF signal applied to a single gain transistor driving two cascode transistors. Splitting the input RF signal at the gate level (as shown in FIG. 6A) may provide better performance (e.g., better gain, noise figure, linearity, and isolation) than splitting the input RF signal at the cascode level. For example, splitting the input RF signal at the gate level may provide good LO-LO isolation (or isolation between LO signals for downconverters for different sets of carriers) of about 35 dB whereas splitting the input RF signal at the cascode level may provide LO-LO isolation of only about 15 dB.

CA LNA 640a includes two distinct signal paths. The first signal path includes amplifier circuit 650a and load circuit 670a. The second signal path includes amplifier circuit 650b and load circuit 670b. The two signal paths can provide two output RF signals for two sets of carriers to two downconverter circuits.

In the multi-output mode, both signal paths are simultaneously turned on, as shown in FIG. 6B. Each signal path amplifies the input RF signal and provides an output RF signal from its load circuit.

In the single-output mode, the first signal path is turned on, and load circuit 670a provides an output RF signal, as shown in FIG. 6C. In addition, gain transistor 654b is turned on in order to reduce changes in the input impedance of CA LNA 640a between the single-output mode and the multi-output mode. Cascode transistor 656b in the second signal path is turned off However, divert cascode transistor 658 is turned on and steers RF current from gain transistor 654b into the first signal path, which then boosts the gain/transconductance of LNA 640a in the single-output mode.

In the exemplary design shown in FIG. 6A, separate source degeneration inductors 652a and 652b are used for amplifier circuits 650a and 650b in order to reduce interaction between the two signal paths and to help reduce noise figure (NF) degradation. Source degeneration inductors 652a and 652b may also improve linearity of amplifier circuits 650a and 650b and help input matching of CA LNA 640a. Inductors 652a and 652b may have the same value or different values. The values of inductors 652a and 652b may be selected (e.g., independently) based on a trade-off between voltage gain and linearity in the single-output mode and the multi-output mode.

As shown in FIG. 6A, a variable capacitor 668a may be present across the gate and source of gain transistor 654a. Capacitor 668a may include parasitic of gain transistor 654a. Capacitor 668a may also include a bank of switchable capacitors, which may be coupled between the gain and source of gain transistor 654a and may be used to fine-tune the input impedance of CA LNA 640a. Each switchable capacitor may be implemented with a capacitor coupled in series with a switch. Similarly, a variable capacitor 668b may be present across the gate and source of gain transistor 654b. Capacitor 668b may include a bank of switchable capacitors, which may be coupled between the gain and source of gain transistor 654b and may be used to fine-tune the input impedance of CA LNA 640a. Input matching circuit 632 is common for both signal paths 648a and 648b and is used for input matching in both the single-output mode and the multi-output mode.

Figure 7A:
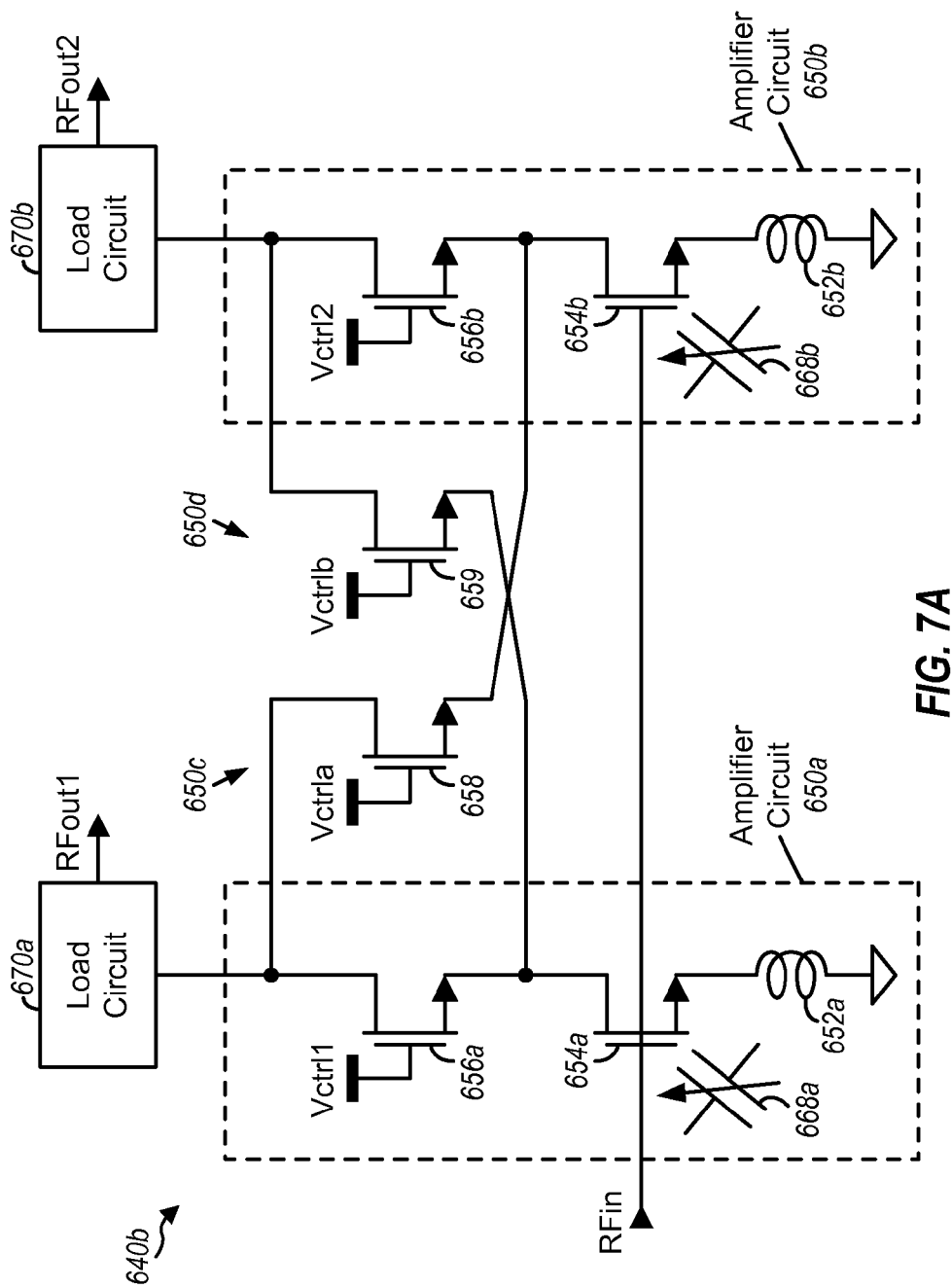
FIGS. 7A to 7C show additional exemplary designs of an LNA with cascode divert switch.

FIG. 7A shows a schematic diagram of an exemplary design of a CA LNA 640b with inductive degeneration and cascode divert switch. CA LNA 640b is another exemplary design of CA LNA 440 in FIG. 4A. CA LNA 640b includes two amplifier circuits 650a and 650b, divert cascode transistor 658, and load circuits 670a and 670b, similar to CA LNA 640a in FIG. 6A. CA LNA 640b further includes a second divert cascode transistor 659 having its source coupled to the drain of gain transistor 654a, its gate receiving a control signal Vctrlb, and its drain coupled to the drain of cascode transistor 656b. Gain transistor 654b, cascode transistor 658, and inductor 652b may be considered as part of amplifier circuit 650c that is coupled in parallel with amplifier circuit 650a. Gain transistor 654a, cascode transistor 659, and inductor 652a may be considered as part of an amplifier circuit 650d that is coupled in parallel with amplifier circuit 650b. CA LNA 640b can provide an amplified RF signal to either load circuit 670a or 670b in the single-output mode. The amplified RF signal may be provided to load circuit 670b by (i) turning on cascode transistors 656b and 659 and (ii) turning off cascode transistors 656a and 658.

Figure 7B:
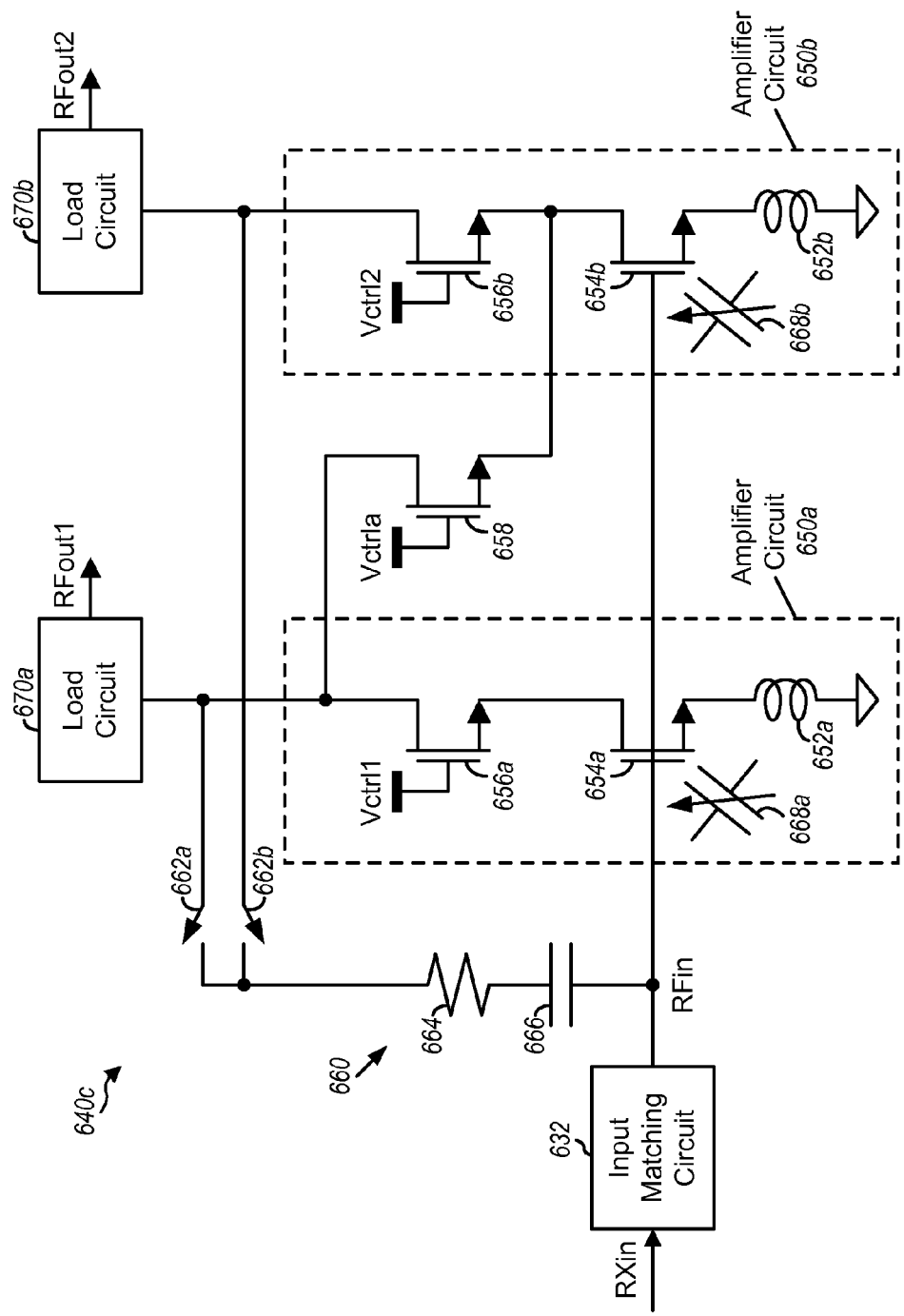

FIG. 7B shows a schematic diagram of an exemplary design of a CA LNA 640c with inductive degeneration, cascode divert switch, and feedback. CA LNA 640c is yet another exemplary design of CA LNA 440 in FIG. 4A. CA LNA 640c includes two amplifier circuits 650a and 650b, divert cascode transistor 658, and load circuits 670a and 670b, similar to CA LNA 640a in FIG. 6A. CA LNA 640c further includes a feedback circuit 660 coupled between the drains of cascode transistors 656a and 656b and the gates of gain transistors 654a and 654b, i.e., between the input and output of amplifier circuits 650a and 650b.

In the exemplary design shown in FIG. 7B, feedback circuit 660 includes switches 662a and 662b, a resistor 664, and a capacitor 666. Resistor 664 and capacitor 666 are coupled in series, with the bottom terminal of capacitor 666 being coupled to the gates of gain transistors 654a and 654b. Switch 662a is coupled between the drain of cascode transistor 656a and the top terminal of resistor 664. Switch 662b is coupled between the drain of cascode transistor 656b and the top terminal of resistor 664. Switches 662a and 662b may each be closed to connect feedback circuit 660 to its associated cascode transistor 656 and may be opened to disconnect feedback circuit 660 from the associated cascode transistor 656. Feedback circuit 660 may also include one or more active circuits such as a transistor. In an exemplary design, feedback circuit 660 may be enabled and used for low-band to provide input power match. For mid-band and high-band, feedback circuit 660 may be disabled, and source degeneration inductors 652a and 652b may be used with matching circuit 632 for input power match. Feedback circuit 660 may also be used in other manners.

Feedback circuit 660 may help with input matching for CA LNA 640c. Input matching circuit 632 is common to both amplifier circuits 650a and 650b and is used in both the single-output mode and the multi-output mode. In the multi-output mode, input matching for CA LNA 640c may be achieved with feedback circuit 660 and switches 662a or 662b around amplifier circuits 650a and 650b as well as source degeneration inductors 652a and 652b. Input matching for CA LNA 640c may be achieved (i) with feedback circuit 660, switch 662a, and source degeneration inductor 652a for the RFout1 signal and (ii) with source degeneration inductor 652b for the RFout2 signal. Alternatively, input matching for CA LNA 640c may be achieved (i) with source degeneration inductor 652a for the RFout1 signal and (ii) with feedback circuit 660, switch 662b, and source degeneration inductor 652b for the RFout2 signal. In the single-output mode, input matching for CA LNA 640c may be achieved with feedback circuit 660, switches 662a or 662b, and source degeneration inductor 652a and 652b. Feedback circuit 660 may help with input matching for the entire LNA 640c in both the single-output mode and the multi-output mode.

Feedback circuit 660 may improve the linearity of amplifier circuits 650a and 650b. Amplifier circuit 650a may be linearized by (i) both source degeneration inductor 652a and feedback circuit 660 when switch 662a is closed or (ii) only source degeneration inductor 652a when switch 662a is opened. Feedback circuit 660 may improve the linearity of amplifier circuit 650a in both the single-output mode and the multi-output mode. This may allow a smaller inductor 652a to be used to obtain the desired linearity for amplifier circuit 650a. Similarly, amplifier circuit 650b may be linearized by (i) both source degeneration inductor 652b and feedback circuit 660 when switch 662b is closed or (ii) only source degeneration inductor 652b when switch 662b is opened. A smaller inductor may be used for inductor 652a and/or 652b to obtain the desired linearity for amplifier circuit 650b with feedback circuit 660 enabled.

In the exemplary design shown in FIG. 7B, only one switch 662a or 662b may be enabled at any given time. In the multi-output mode, feedback circuit 660 may be used to linearize one amplifier circuit 650a or 650b but may provide input match for both amplifier circuits. The other amplifier circuit without feedback may be linearized via its degeneration inductor. In the single-output mode, only one amplifier circuit 650a or 650b and the feedback around this amplifier circuit may be enabled. The other amplifier circuit and its corresponding feedback switch may be disabled.

Figure 7C:
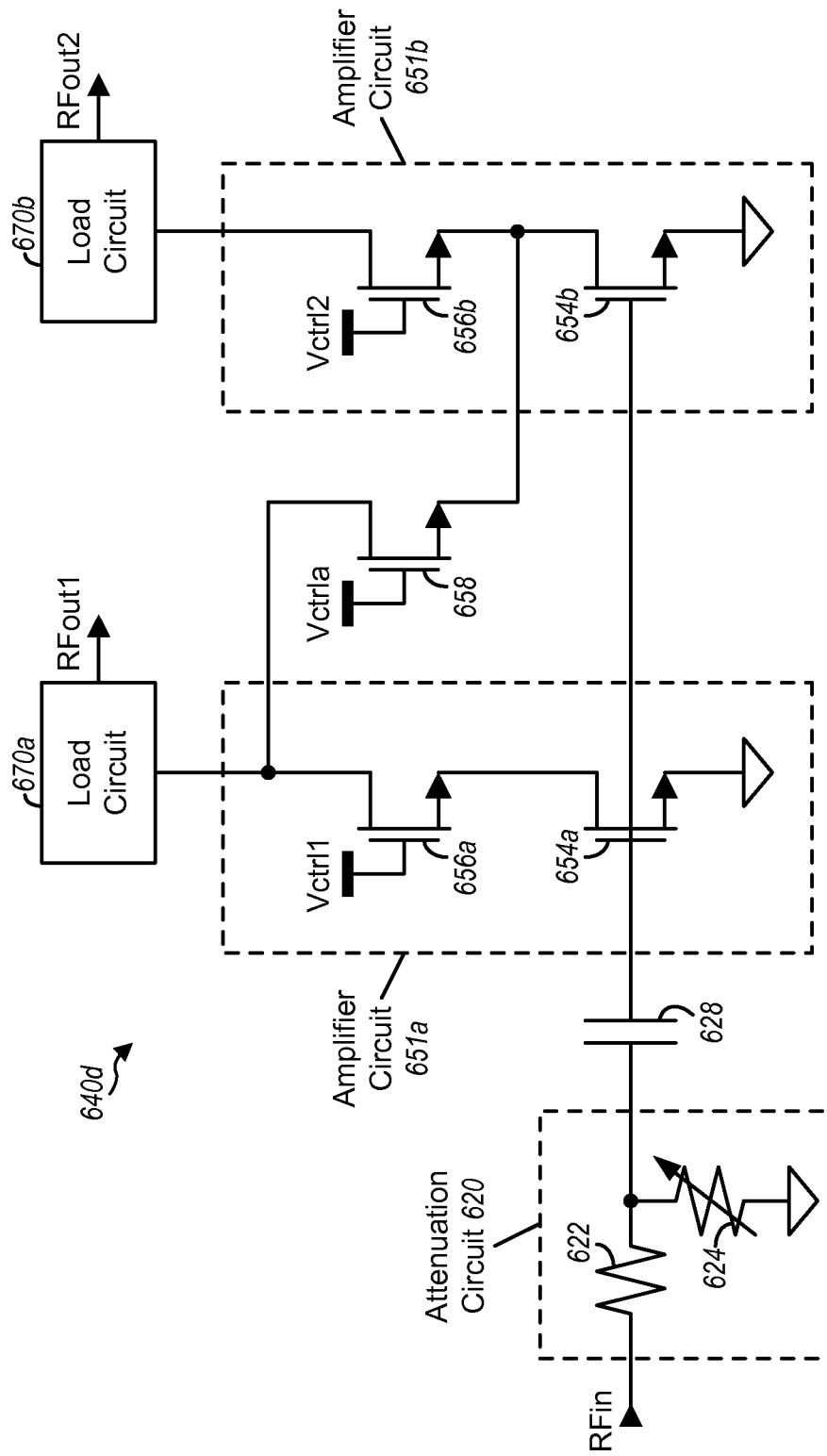

FIG. 7C shows a schematic diagram of an exemplary design of a CA LNA 640d with cascode divert switch and no source degeneration inductors. CA LNA 640d is yet another exemplary design of CA LNA 440 in FIG. 4A. CA LNA 640d includes two amplifier circuits 651a and 651b, divert cascode transistor 658, and two load circuits 670a and 670b.

An attenuation circuit 620 receives an input RF signal and provides an attenuated input RF signal to CA LNA 640d. Attenuation circuit 620 includes (i) a resistor 622 coupled between the input and output of attenuation circuit 620 and (ii) a variable resistor 624 coupled between the output of attenuation circuit 620 and circuit ground. An AC coupling capacitor 628 is coupled between the output of attenuation circuit 620 and the input of amplifier circuit 651a.

Amplifier circuit 651a includes gain transistor 654a and cascode transistor 656a. Gain transistor 654a has its gate coupled to AC coupling capacitor 628 and its source coupled to circuit ground (as shown in FIG. 7C) or to a source degeneration inductor (not shown in FIG. 7C). Cascode transistor 656a has its gate receiving the Vctrl1 signal, its source coupled to the drain of gain transistor 654a, and its drain coupled to load circuit 670a. Amplifier circuit 651b includes gain transistor 654b and cascode transistor 656b, which are coupled in similar manner as gain transistor 654a and cascode transistor 656a in amplifier circuit 651a. Divert cascode transistor 658 has its source coupled to the drain of gain transistor 654b, its gate receiving the Vctrla signal, and its drain coupled to the drain of cascode transistor 656a.

CA LNA 640d may be advantageously used in a scenario in which the input RF signal includes jammers, which are large undesired signals close in frequency to desired signals. Attenuation circuit 620 may be programmable (e.g., as shown in FIG. 7C) or may be fixed (not shown in FIG. 7C). Attenuation circuit 620 may serve a dual purpose of attenuating the jammers in the input RF signal and providing a good input match for CA LNA 640d.

FIGS. 6A, 7A, 7B and 7C show some exemplary designs of a CA LNA with cascode divert switch, which may be implemented in other manners. In another exemplary design, a CA LNA may include multiple gain transistors having their sources coupled to a single shared source degeneration inductor. For example, in FIG. 6A, the source of gain transistor 654b may be coupled to inductor 652a, and inductor 652b may be omitted. Input matching circuit 632 in FIGS. 6A, 7A and 7C and attenuation circuit 620 in FIG. 7B may also be replaced with a tunable matching circuit having at least one tunable circuit component (e.g., at least one adjustable capacitor) that can be adjusted to vary input matching.

MIMO LNA 540 in FIG. 5A may be implemented with various circuit architectures. Some exemplary designs of MIMO LNA 540 are described below. MIMO LNA 540 may also be implemented with transistors of various types. Some exemplary designs of MIMO LNA 540 implemented with NMOS transistors are described below.

Figure 8A:
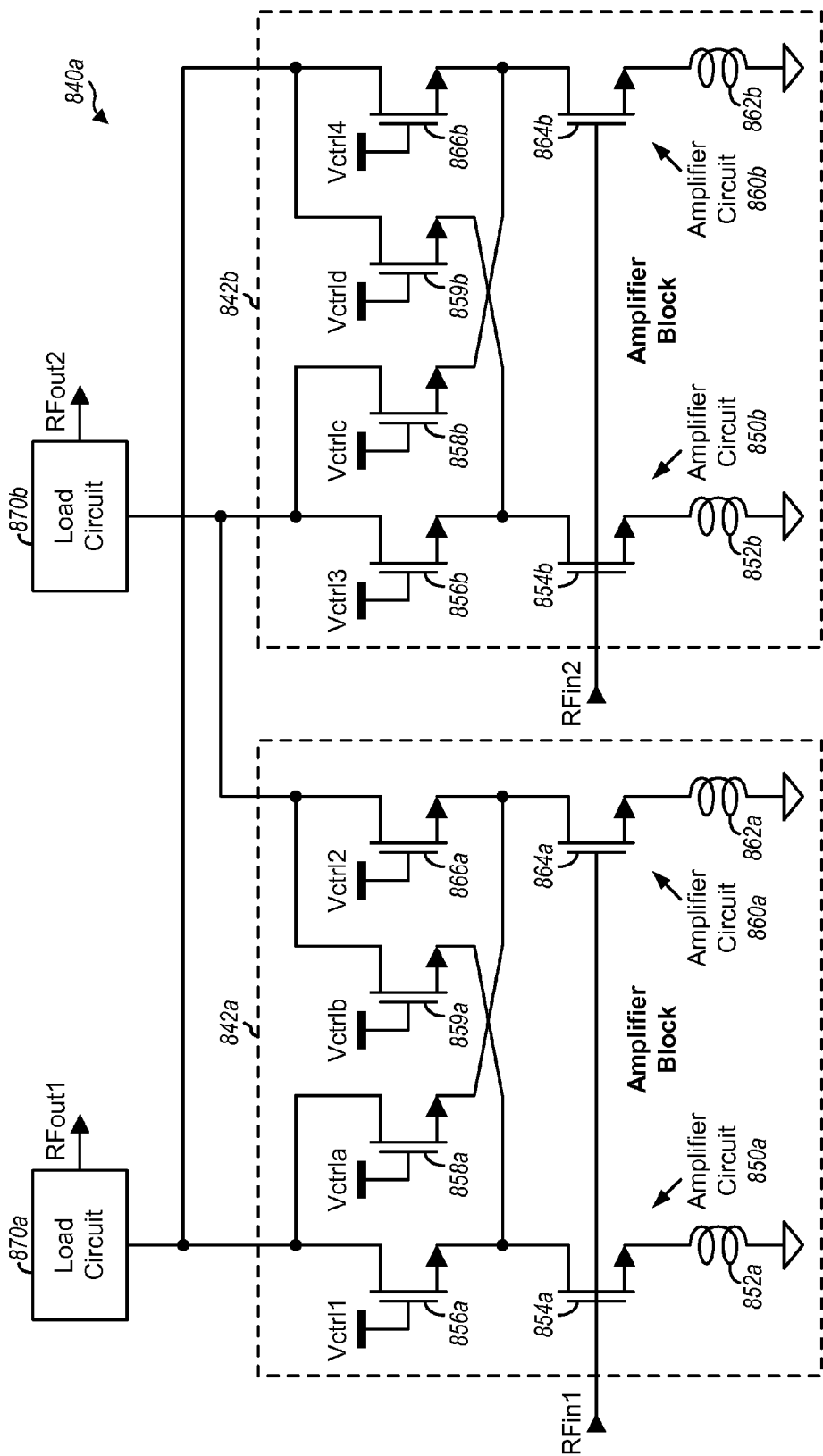
FIGS. 8A to 8C show exemplary designs of a multiple-input multiple-output (MIMO) LNA with cascode divert switch.

FIG. 8A shows a schematic diagram of an exemplary design of a 2×2 MIMO LNA 840a with cascode divert switch. MIMO LNA 840a is one exemplary design of MIMO LNA 540 in FIG. 5A. MIMO LNA 840a includes two amplifier blocks 842a and 842b for two LNA inputs and two load circuits 870a and 870b for two LNA outputs.

In the exemplary design shown in FIG. 8A, amplifier block 842a includes two amplifier circuits 850a and 860a and divert cascode transistors 858a and 859a. Amplifier block 842b includes two amplifier circuits 850b and 860b and divert cascode transistors 858b and 859b. Each amplifier circuit 850 includes a gain transistor 854, a cascode transistor 856, and a source degeneration inductor 852, which are coupled in similar manner as gain transistor 654a, cascode transistor 656a, and inductor 652a in FIG. 6A. Each amplifier circuit 860 includes a gain transistor 864, a cascode transistor 866, and a source degeneration inductor 862, which are also coupled in similar manner as gain transistor 654a, cascode transistor 656a, and inductor 652a in FIG. 6A. Within amplifier block 842a, divert cascode transistor 858a has its source coupled to the drain of gain transistor 864a and its drain coupled to the drain of cascode transistor 856a. Divert cascode transistor 859a has its source coupled to the drain of gain transistor 854a and its drain coupled to the drain of cascode transistor 866a. Within amplifier block 842b, divert cascode transistor 858b has its source coupled to the drain of gain transistor 864b and its drain coupled to the drain of cascode transistor 856b. Divert cascode transistor 859b has its source coupled to the drain of gain transistor 854b and its drain coupled to the drain of cascode transistor 866b. Gain transistors 854 and 864 and cascode transistors 856, 858, 859 and 866 may be implemented with NMOS transistors, as shown in FIG. 8A, or with transistors of other types.

A first input RF signal, RFin1, is provided to the gates of gain transistors 854a and 864a in amplifier block 842a. A second input RF signal, RFin2, is provided to the gates of gain transistors 854b and 864b in amplifier block 842b. Cascode transistors 856a, 866a, 856b and 866b have their gates receiving control signals Vctrl1, Vctrl2, Vctrl3 and Vctrl4, respectively. Divert cascode transistors 858a, 859a, 858b and 859b have their gates receiving control signals Vctrla, Vctrlb, Vctrlc and Vctrld, respectively. Cascode transistors 856a and 866b have their drains coupled to load circuit 870a, and cascode transistors 856b and 866a have their drains coupled to load circuit 870b.

MIMO LNA 840a may support a single-output mode, an intra-band CA mode, and an inter-band CA mode. The single-output mode may be used to receive a transmission sent on a single carrier without carrier aggregation or transmissions sent on multiple carriers with carrier aggregation. In the single-output mode, a single input RF signal is applied to a single amplifier block 842. Both gain transistors 854 and 864 and either cascode transistors 856 and 858 or cascode transistors 859 and 866 in this amplifier block 842 are enabled and provide an amplified RF signal. One cascode transistor and one divert cascode transistor are enabled, and the other cascode transistor and the other divert cascode transistor are disabled. A single load circuit 870 receives the amplified RF signal and provides a single output RF signal for one set of carriers. Amplifier circuits 850 and 860 are symmetric with amplifier block 842. The RFin signal may be diverted to one of the two outputs. The amplifier circuit for the selected output is enabled, and the divert cascode transistor coupled in parallel with this amplifier circuit is also enabled.

In the intra-band CA mode, a single input RF signal is applied to a single amplifier block 842. Both gain transistors 854 and 864 and both cascode transistors 856 and 866 in this amplifier block 842 are enabled and provide two amplified RF signals. Both divert cascode transistors 858 and 859 are disabled. Two load circuits 870 receive the two amplified RF signals and provide two output RF signals for two sets of carriers.

In the inter-band CA mode, two input RF signals are applied to two amplifier blocks 842. In each amplifier block 84, both gain transistors 854 and 864 and either cascode transistors 856 and 858 or cascode transistors 859 and 866 are enabled to provide an amplified RF signal. Two load circuits 870 receive two amplified RF signals from the two amplifier blocks 842 and provide two output RF signals for two sets of carriers.

Figure 8B:
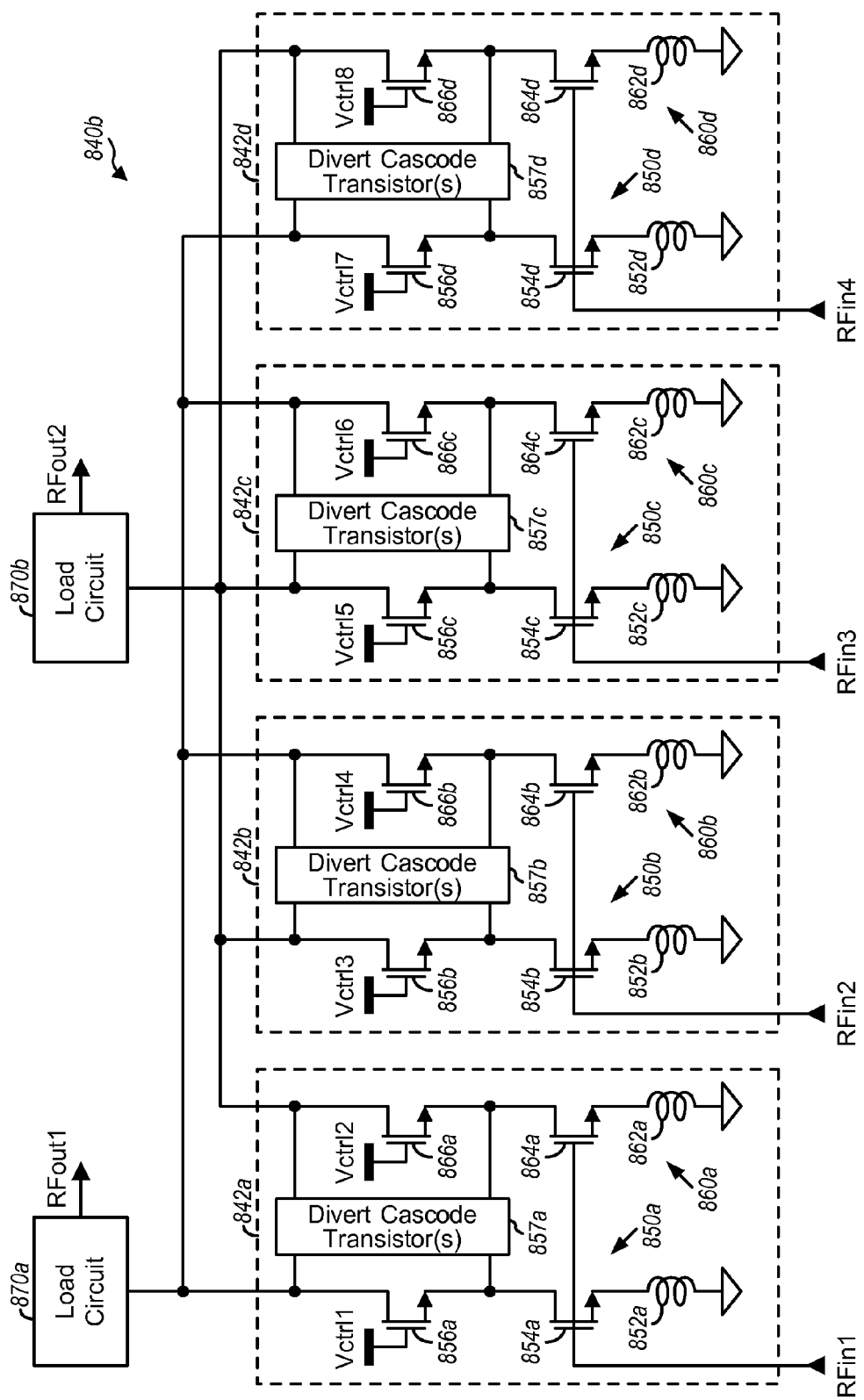

FIG. 8B shows a schematic diagram of an exemplary design of a 4×2 MIMO LNA 840b with cascode divert switch. MIMO LNA 840b is another exemplary design of MIMO LNA 540 in FIG. 5A. MIMO LNA 840b includes four amplifier blocks 842a to 842d for four LNA inputs and two load circuits 870a and 870b for two LNA outputs.

In the exemplary design shown in FIG. 8B, each amplifier block 842 includes two amplifier circuits 850 and 860 and one or more divert cascode transistors 857. Each amplifier circuit 850 includes gain transistor 854, cascode transistor 856, and source degeneration inductor 852. Each amplifier circuit 860 includes gain transistor 864, cascode transistor 866, and source degeneration inductor 862. Within each amplifier block 842, divert cascode transistor(s) 857 may include divert cascode transistor 858 and/or 859 in FIG. 8A. Divert cascode transistor 858 (if present) has its source coupled to the drain of gain transistor 864 and its drain coupled to the drain of cascode transistor 856. Divert cascode transistor 859 (if present) has its source coupled to the drain of gain transistor 854 and its drain coupled to the drain of cascode transistor 866.

Four input RF signals, RFin1 to RFin4, are provided to amplifier blocks 842a to 842d, respectively. Cascode transistors 856a, 856d, 866b and 866c have their drains coupled to load circuit 870a. Cascode transistors 856b, 856c, 866a and 866d have their drains coupled to load circuit 870b.

MIMO LNA 840b may support the single-output mode, the intra-band CA mode, and the inter-band CA mode. In the single-output mode, a single input RF signal may be received via any one of the four LNA inputs and applied to a single amplifier block 842. This amplifier block 842 amplifies the input RF signal and provides an amplified RF signal to a single load circuit 870. This load circuit 870 provides a single output RF signal for one set of carriers to one of the two LNA outputs.

In the intra-band CA mode, a single input RF signal may be received via any one of the four LNA inputs and applied to a single amplifier block 842. This amplifier block 842 amplifies the input RF signal and provides two amplified RF signals to two load circuits 870. The two load circuits 870 provide two output RF signals for two sets of carriers to two LNA outputs. MIMO LNA 840b allows an input RF signal to be applied to any amplifier block 842 and routed to any load circuit 870.

In the inter-band CA mode, two input RF signals may be received via two of the four LNA inputs and applied to two amplifier blocks 842. These two amplifier blocks 842 amplify the two input RF signals and provide two amplified RF signals to two load circuits 870. The two load circuits 870 provide two output RF signals for two sets of carriers to two LNA outputs. In the exemplary design shown in FIG. 8B, MIMO LNA 840b supports six combinations of input RF signals in the inter-band CA mode. In particular, the following combinations of input RF signals may be support: (RFin1, RFin2), (RFin1, RFin3), (RFin1, RFin4), (RFin2, RFin3), (RFin2, RFin4), and (RFin3, RFin4).

Figure 8C:
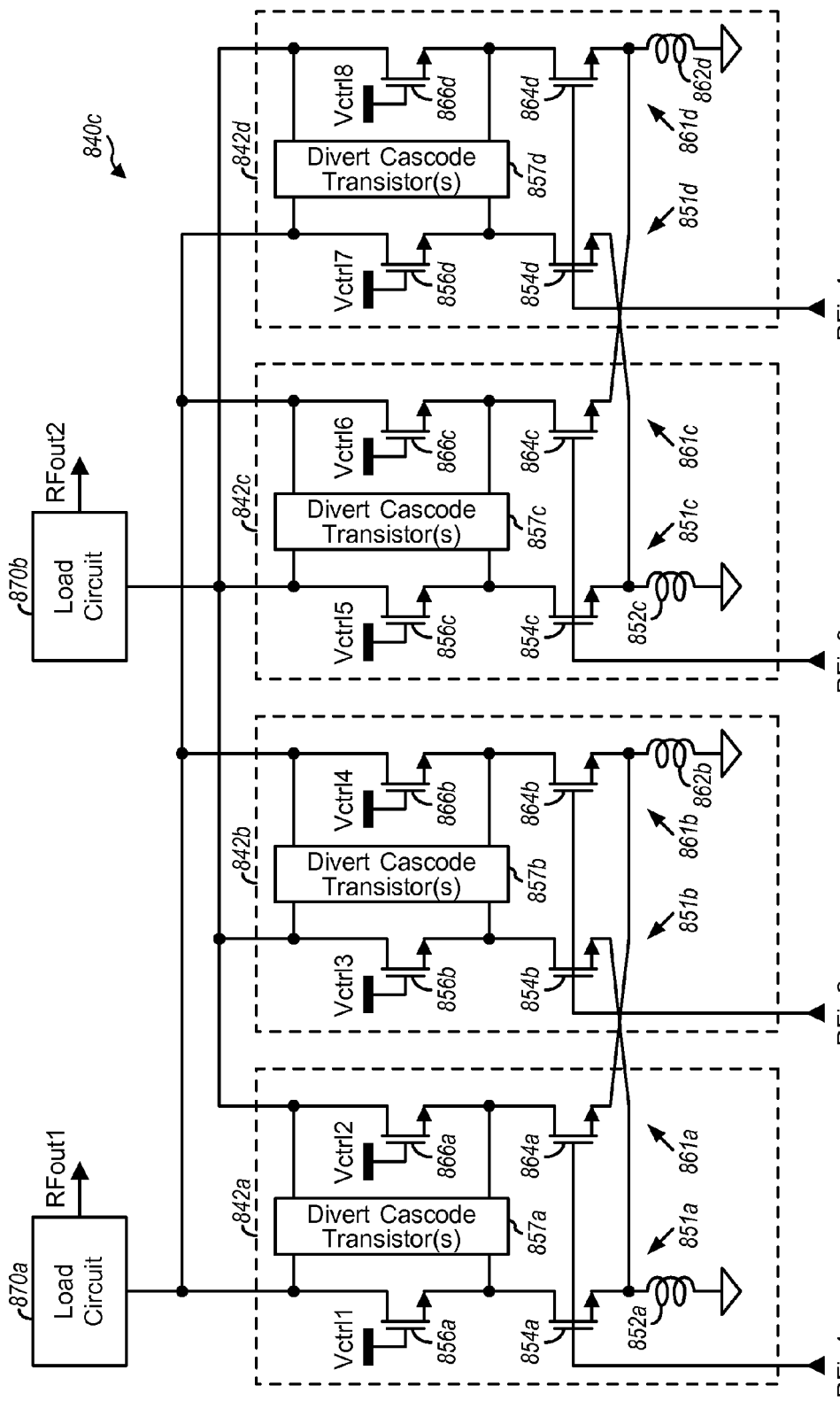

FIG. 8C shows a schematic diagram of an exemplary design of a 4×2 MIMO LNA 840c with cascode divert switch. MIMO LNA 840c is yet another exemplary design of MIMO LNA 540 in FIG. 5A. MIMO LNA 840c includes four amplifier blocks 844a to 844d for four LNA inputs and two load circuits 870a and 870b for two LNA outputs. Each amplifier block 844 includes amplifier circuits 851 and 861 and one or more divert cascode transistors 857. Divert cascode transistor(s) 857 may include divert cascode transistor 858 and/or 859 in FIG. 8A. Each amplifier circuit 851 includes gain transistor 854 and cascode transistor 856. Each amplifier circuit 861 includes gain transistor 864 and cascode transistor 866. Gain transistors 854a and 854b share the same source degeneration inductor 852a and have their sources coupled to inductor 852a. Gain transistors 864a and 864b share the same source degeneration inductor 862b and have their sources coupled to inductor 862b. Gain transistors 854c and 854d share the same source degeneration inductor 852c and have their sources coupled to inductor 852c. Gain transistors 864c and 864d share the same source degeneration inductor 862d and have their sources coupled to inductor 862d. MIMO LNA 840c in FIG. 8C includes half of the source degeneration inductors as MIMO LNA 840b in FIG. 8B, which may provide some advantages such as smaller circuit area, lower cost, etc.

MIMO LNA 840c may support the single-output mode and the intra-band CA mode as described above for MIMO LNA 840b in FIG. 8B. MIMO LNA 840c may also support the inter-band CA mode. In particular, LNA 840c may support four combinations of input RF signals, (RFin1, RFin3), (RFin1, RFin4), (RFin2, RFin3) and (RFin2, RFin4), in the inter-band CA mode.

The CA LNAs and MIMO LNAs described herein may have one or more of the following desirable features:
1. Small change in input impedance between single-output mode and CA mode,
2. Higher gain in single-output mode with RF current steering by divert cascode transistor,
3. Single-ended LNA inputs and differential LNA outputs,
4. Transformer/inductive loads for MIMO LNA, and
5. Inductive degeneration at LNA inputs for high gain and bypassed for low gain.

Small change in input impedance between different operating modes may improve performance. Higher gain in the single-output mode may also improve performance.

Single-ended LNA inputs may reduce the number of input ports as well as the number of circuit components for input matching circuits on a printed circuit board (PCB) containing a MIMO LNA. Alternatively, a MIMO LNA may support twice as many amplifier circuits for a given number of input ports with single-ended LNA inputs. Differential LNA outputs may reduce LO leakage and second-order effects by balancing the signals in downconverter circuits. In general, all advantages of differential circuits versus single-ended circuits may be obtained with differential LNA outputs.

Transformer/inductive loads may allow an LNA to operate with a low power supply voltage since these circuit components do not waste any voltage headroom. Other types of loads (e.g., active/transistor loads) may degrade gain, noise figure, and linearity of the LNA.

Inductive degeneration may be used to improve linearity in high-gain LNA as well as to aid input matching to a target impedance (e.g., 50 Ohms) Without degeneration inductors, receiver performance (e.g., for input matching and linearity) may not meet specification requirements.

In an exemplary design, an apparatus (e.g., a wireless device, an IC, a circuit module, etc.) may include first and second amplifier circuits and a cascode transistor. The first amplifier circuit (e.g., amplifier circuit 650a in FIG. 6A) may receive an input RF signal comprising transmissions sent on multiple carriers at different frequencies to a wireless device. The second amplifier circuit (e.g., amplifier circuit 650b) may comprise a gain transistor (e.g., gain transistor 654b) and may also receive the input RF signal. The cascode transistor (e.g., divert cascode transistor 658) may be coupled between the output of the first amplifier circuit and the gain transistor in the second amplifier circuit. The gain transistor in the second amplifier circuit and the cascode transistor may be considered as an additional amplifier circuit (e.g., amplifier circuit 650c in FIG. 6A), which (i) is coupled in parallel with the first amplifier circuit and (ii) shares a gain transistor with the second amplifier circuit. The apparatus may further comprise a second cascode transistor (e.g., divert cascode transistor 659 in FIG. 7A) coupled between the output of the second amplifier circuit and a gain transistor in the first amplifier circuit. The gain transistor in the first amplifier circuit and the second cascode transistor may be considered as another amplifier circuit that (i) is coupled in parallel with the second amplifier circuit and (ii) shares a gain transistor with the first amplifier circuit.

The apparatus may further comprise first and second load circuits. The first load circuit (e.g., load circuit 670a in FIG. 6A) may be coupled to the first amplifier circuit. The second load circuit (e.g., load circuit 670b) may be coupled to the second amplifier circuit. In an exemplary design, the first load circuit may comprise a transformer (e.g., transformer 672a) having a primary coil and a secondary coil. The primary coil (e.g., primary coil 674a) may be coupled between the first amplifier circuit and a power supply. The secondary coil (e.g., secondary coil 676a) may provide a differential output RF signal when an amplified RF signal from the first amplifier circuit is applied to the primary coil. The second load circuit may comprise another transformer (e.g., transformer 672b). The first and second load circuits may also comprise other circuit components such as inductors, capacitors, transistors, etc.

In one exemplary design, the input RF signal may comprise a single-ended signal. The first and second load circuits may provide differential output RF signals, e.g., as shown in FIG. 6A. In general, the input and output RF signals may each comprise a single-ended signal or a differential signal.

In an exemplary design, the first amplifier circuit may comprise a first inductor (e.g., inductor 652a in FIG. 6A) coupled between the source of a gain transistor in the first amplifier circuit and circuit ground. The second amplifier circuit may comprise a second inductor (e.g., inductor 652b) coupled between the source of the gain transistor in the second amplifier circuit and circuit ground. In another exemplary design, the gain transistors in the first and second amplifier circuits may have their sources coupled directly to circuit ground, e.g., as shown in FIG. 7C. In yet another exemplary design, the gain transistors in the first and second amplifier circuits may have their sources coupled to a shared inductor.

In an exemplary design, the apparatus may further comprise a feedback circuit (e.g., feedback circuit 660 in FIG. 7B) coupled between the output and input of at least one of the first and second amplifier circuits. The feedback circuit may comprise a resistor, a capacitor, a transistor, some other circuit component, or a combination thereof.

In an exemplary design, the apparatus may comprise an input matching circuit (e.g., input matching circuit 432 in FIG. 4B) coupled to the first and second amplifier circuits. In another exemplary design, the apparatus may comprise an attenuation circuit (e.g., attenuation circuit 620 in FIG. 7C) coupled to the first and second amplifier circuits and configured to receive the input RF signal and provide an attenuated input RF signal to the first and second amplifier circuits.

In an exemplary design, the apparatus may further comprise first and second downconverter circuits. The first downconverter circuit (e.g., downconverter circuit 490a in FIG. 4B) may be coupled to the first load circuit and may perform downconversion for a first output RF signal from the first load circuit based on a first LO signal at a first frequency. The second downconverter circuit (e.g., downconverter circuit 490b) may be coupled to the second load circuit and may perform downconversion for a second output RF signal from the second load circuit based on a second LO signal at a second frequency. The second frequency may be different from the first frequency. The first downconverter circuit may perform downconversion for a first set of carriers being received by the apparatus. The second downconverter circuit may perform downconversion for a second set of carriers being received by the apparatus. The first and second frequencies may be selected based on the first and second sets of carriers, respectively, being received.

The apparatus may operate in one of multiple operating modes. The first amplifier circuit may be enabled to amplify the input RF signal and provide a first amplified RF signal, and the second amplifier circuit may be enabled to amplify the input RF signal and provide a second amplified RF signal in a first operating mode, e.g., a multi-output mode, as shown in FIG. 6B. The first and second amplified RF signals may be for two sets of carriers being received by the apparatus. The first amplifier circuit, the gain transistor in the second amplifier circuit, and the cascode transistor may be enabled to amplify the input RF signal and provide an amplified RF signal in a second operating mode, e.g., a single-output mode, as shown in FIG. 6C. The amplified RF signal may be for one set of carriers being received by the apparatus.

In an exemplary design, the apparatus may further comprise third and fourth amplifier circuits and a second cascode transistor. The third amplifier circuit (e.g., amplifier circuit 850b in FIG. 8A) may receive a second input RF signal. The fourth amplifier circuit (e.g., amplifier circuit 860b) may also receive the second input RF signal. The second cascode transistor (e.g., cascode transistor 858b) may be coupled between the output of the third amplifier circuit and a gain transistor in the fourth amplifier circuit. The apparatus may further comprise third and fourth cascode transistors. The third cascode transistor (e.g., divert cascode transistor 859a in FIG. 8A) may be coupled between the output of the second amplifier circuit and a gain transistor in the first amplifier circuit. The fourth cascode transistor (e.g., divert cascode transistor 859b in FIG. 8A) may be coupled between the output of the fourth amplifier circuit and a gain transistor in the third amplifier circuit. In general, a MIMO LNA may comprise the first and second amplifier circuits and at least one additional set (e.g., pair) of amplifier circuits. Each set of amplifier circuits may receive a respective input RF signal. Each set of amplifier circuits may be associated with one or more divert cascode transistors, and each divert cascode transistor may be coupled between two amplifier circuits in the set of amplifier circuits.

In an exemplary design, the gain transistor in each amplifier circuit may be coupled to a separate source degeneration inductor, e.g., as shown in FIGS. 8A and 8B. In another exemplary design, multiple gain transistors in multiple amplifier circuits may share a source degeneration inductor. For example, a first inductor (e.g., inductor 852a in FIG. 8C) may be coupled to the sources of two gain transistors in two amplifier circuits, and a second inductor (e.g., inductor 862b in FIG. 8C) may be coupled to the sources of two other gain transistors in two other amplifier circuits.

Figure 9:
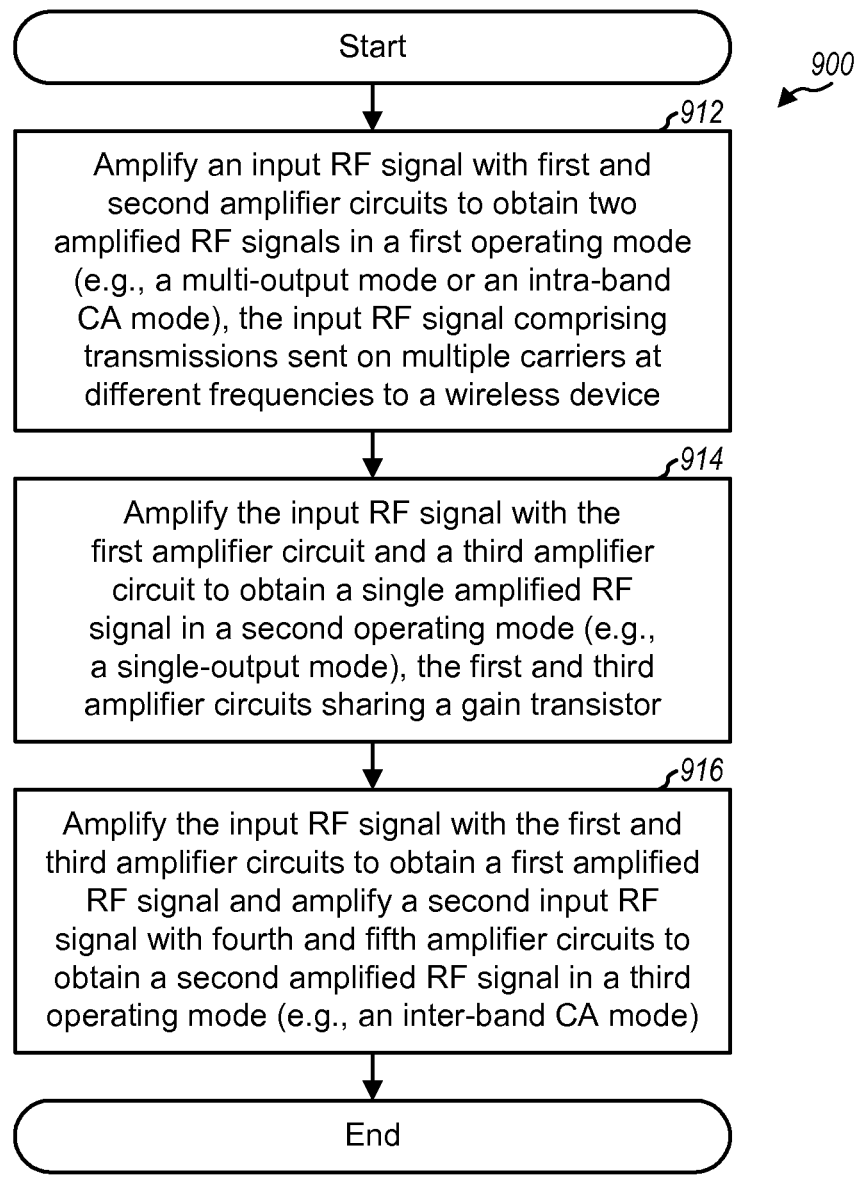
FIG. 9 shows a process for performing signal amplification.

FIG. 9 shows an exemplary design of a process 900 for performing signal amplification in a wireless system. Process 900 may be performed by a wireless device or by some other entity. An input RF signal may be amplified with first and second amplifier circuits (e.g., amplifier circuits 650a and 650b in FIG. 7A) to obtain two amplified RF signals in a first operating mode (e.g., a multi-output mode or an intra-band CA mode in FIG. 6B) (block 912). The input RF signal may comprise transmissions sent on multiple carriers at different frequencies to a wireless device. Each amplified RF signal may be for a different set of carriers being received by the wireless device. The input RF signal may be amplified with the first amplifier circuit and a third amplifier circuit (e.g., amplifier circuit 650c or 650d in FIG. 7A) to obtain a single amplified RF signal in a second operating mode (e.g., a single-output mode in FIG. 6C) (block 914). The first and third amplifier circuits may be coupled in parallel and may have their inputs coupled together and their outputs coupled together. The second and third amplifier circuits may share a gain transistor (e.g., gain transistor 654a or 654b in FIG. 7A).

The input RF signal may be amplified with the first and third amplifier circuits to obtain a first amplified RF signal, and a second input RF signal may be amplified with fourth and fifth amplifier circuits to obtain a second amplified RF signal in a third operating mode (e.g., an inter-band CA mode) (block 916). The fourth amplifier circuit may correspond to amplifier circuit 850b in FIG. 8A. The fifth amplifier circuit may comprise gain transistor 864b and cascode transistor 858b in FIG. 8A.

The LNAs described herein may be implemented on an IC, an analog IC, an RFIC, a mixed-signal IC, an ASIC, a PCB, an electronic device, etc. The LNAs may also be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the LNAs described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
a first amplifier circuit configured to receive an input radio frequency (RF) signal comprising transmissions sent on multiple carriers at different frequencies to a wireless device;
a second amplifier circuit comprising a gain transistor and configured to receive the input RF signal; and
a cascode transistor coupled between an output of the first amplifier circuit and the gain transistor in the second amplifier circuit.

2. The apparatus of claim 1, further comprising:
a second cascode transistor coupled between an output of the second amplifier circuit and a gain transistor in the first amplifier circuit.

3. The apparatus of claim 1, further comprising:
a first load circuit coupled to the first amplifier circuit; and
a second load circuit coupled to the second amplifier circuit.

4. The apparatus of claim 3, further comprising:
a first downconverter circuit coupled to the first load circuit and configured to perform downconversion for a first output RF signal from the first load circuit based on a first local oscillator (LO) signal at a first frequency; and
a second downconverter circuit coupled to the second load circuit and configured to perform downconversion for a second output RF signal from the second load circuit based on a second LO signal at a second frequency different from the first frequency.

5. The apparatus of claim 1, the second amplifier circuit comprising an inductor coupled between a source of the gain transistor and circuit ground.

6. The apparatus of claim 1, further comprising:
a feedback circuit coupled between an output and an input of at least one of the first and second amplifier circuits.

7. The apparatus of claim 6, the feedback circuit comprising at least one of a resistor, a capacitor, or a transistor.

8. The apparatus of claim 1, further comprising:
an attenuation circuit coupled to the first and second amplifier circuits and configured to receive the input RF signal and provide an attenuated input RF signal to the first and second amplifier circuits.

9. The apparatus of claim 3, the first load circuit comprising a transformer having a primary coil and a secondary coil, the primary coil being coupled between the first amplifier circuit and a power supply, and the secondary coil providing a differential output RF signal when an amplified RF signal from the first amplifier circuit is applied to the primary coil.

10. The apparatus of claim 3, the input RF signal comprising a single-ended signal, and the first and second load circuits providing differential output RF signals.

11. The apparatus of claim 1, the first amplifier circuit being enabled to amplify the input RF signal and provide a first amplified RF signal and the second amplifier circuit being enabled to amplify the input RF signal and provide a second amplified RF signal in a first operating mode.

12. The apparatus of claim 11, the first amplifier circuit, the gain transistor in the second amplifier circuit, and the cascode transistor being enabled to amplify the input RF signal and provide an amplified RF signal in a second operating mode.

13. The apparatus of claim 1, further comprising:
a third amplifier circuit configured to receive a second input RF signal;
a fourth amplifier circuit configured to receive the second input RF signal; and
a second cascode transistor coupled between an output of the third amplifier circuit and a gain transistor in the fourth amplifier circuit.

14. The apparatus of claim 13, further comprising:
a third cascode transistor coupled between an output of the second amplifier circuit and a gain transistor in the first amplifier circuit; and
an fourth cascode transistor coupled between an output of the fourth amplifier circuit and a gain transistor in the third amplifier circuit.

15. The apparatus of claim 13, further comprising:
a first inductor coupled to sources of gain transistors in two of the first to fourth amplifier circuits; and
a second inductor coupled to sources of gain transistors in remaining two of the first to fourth amplifier circuits.

16. The apparatus of claim 1, further comprising:
at least one additional set of amplifier circuits, each additional set of amplifier circuits receiving a respective input RF signal; and
at least one additional cascode transistor for each additional set of amplifier circuits, each additional cascode transistor being coupled between two amplifier circuits in the set of amplifier circuits.

17. A method comprising:
amplifying an input radio frequency (RF) signal with first and second amplifier circuits to obtain two amplified RF signals in a first operating mode, the input RF signal comprising transmissions sent on multiple carriers at different frequencies to a wireless device; and
amplifying the input RF signal with the first amplifier circuit and a third amplifier circuit to obtain a single amplified RF signal in a second operating mode, the second and third amplifier circuits sharing a gain transistor.

18. The method of claim 17, further comprising:
amplifying the input RF signal with the first and third amplifier circuits to obtain a first amplified RF signal and amplifying a second input RF signal with fourth and fifth amplifier circuits to obtain a second amplified RF signal in a third operating mode.

19. An apparatus comprising:
first means for amplifying configured to amplify an input radio frequency (RF) signal when the first means for amplifying is enabled, the input RF signal comprising transmissions sent on multiple carriers at different frequencies to a wireless device;
second means for amplifying configured to amplify the input RF signal when the second means for amplifying is enabled; and
third means for amplifying configured to amplify the input RF signal when the third means for amplifying is enabled, the third means for amplifying being coupled in parallel with the first means for amplifying and sharing amplification means with the second means for amplifying.

20. The apparatus of claim 19, further comprising:
fourth means for amplifying configured to amplify a second input RF signal when the fourth means for amplifying is enabled;
fifth means for amplifying configured to amplify the second input RF signal when the fifth means for amplifying is enabled; and
sixth means for amplifying configured to amplify the second input RF signal when the sixth means for amplifying is enabled, the sixth means for amplifying being coupled in parallel with the fourth means for amplifying and sharing amplification means with the fifth means for amplifying.

* * * * *